(12) United States Patent
Kim et al.

(10) Patent No.: US 10,840,187 B2
(45) Date of Patent: Nov. 17, 2020

(54) THREE-DIMENSIONAL SEMICONDUCTOR DEVICE

(71) Applicant: SAMSUNG ELECTRONICS CO., LTD., Suwon-si (KR)

(72) Inventors: Young-woo Kim, Hwaseong-si (KR); Joon-sung Lim, Yongin-si (KR); Jang-gn Yun, Hwaseong-si (KR); Sung-min Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/689,628

(22) Filed: Nov. 20, 2019

(65) Prior Publication Data

US 2020/0091084 A1 Mar. 19, 2020

Related U.S. Application Data

(63) Continuation of application No. 15/822,329, filed on Nov. 27, 2017, now Pat. No. 10,504,844.

(30) Foreign Application Priority Data

Mar. 3, 2017 (KR) .................. 10-2017-0027776

(51) Int. Cl.
| | |
|---|---|
| *H01L 23/532* | (2006.01) |
| *H01L 27/11531* | (2017.01) |
| *H01L 27/11573* | (2017.01) |
| *H01L 23/522* | (2006.01) |
| *H01L 27/11565* | (2017.01) |
| *H01L 27/11582* | (2017.01) |
| *H01L 27/11519* | (2017.01) |
| *H01L 27/1157* | (2017.01) |
| *H01L 27/11575* | (2017.01) |

(Continued)

(52) U.S. Cl.
CPC .... *H01L 23/53295* (2013.01); *H01L 23/5226* (2013.01); *H01L 27/1157* (2013.01); *H01L 27/11519* (2013.01); *H01L 27/11531* (2013.01); *H01L 27/11565* (2013.01); *H01L 27/11573* (2013.01); *H01L 27/11575* (2013.01); *H01L 27/11582* (2013.01); *H01L 27/11556* (2013.01); *H01L 27/1207* (2013.01)

(58) Field of Classification Search
CPC ......... H01L 23/53295; H01L 27/10897; H01L 27/11526
See application file for complete search history.

(56) References Cited

U.S. PATENT DOCUMENTS

| | | |
|---|---|---|
| 8,455,346 B2 | 6/2013 | Nojiri et al. |
| 8,883,611 B2 | 11/2014 | Lee et al. |
| 8,896,046 B2 | 11/2014 | Kato |

(Continued)

FOREIGN PATENT DOCUMENTS

| | | |
|---|---|---|
| JP | 2014-22488 A | 2/2014 |
| KR | 10-2013-0025207 A | 3/2013 |

*Primary Examiner* — Thomas L Dickey
(74) *Attorney, Agent, or Firm* — Lee IP Law, P.C.

(57) ABSTRACT

A three-dimensional (3D) semiconductor device includes a substrate having a cell array region and a peripheral circuit region. A cell array structure is in the cell array region and includes a 3D memory cell array. A peripheral logic structure is in the peripheral circuit region and includes a peripheral circuit transistor. A cell insulating layer insulates the cell array structure. A peripheral insulating layer is insulated from the peripheral logic structure and the cell array region and has a porous layer.

20 Claims, 26 Drawing Sheets

(51) Int. Cl.
*H01L 27/12* (2006.01)
*H01L 27/11556* (2017.01)

(56) References Cited

U.S. PATENT DOCUMENTS

| | | |
|---|---|---|
| 9,177,966 B1 | 11/2015 | Rabkin et al. |
| 9,425,299 B1 | 8/2016 | Rabkin et al. |
| 9,478,495 B1 | 10/2016 | Pachamuthu et al. |
| 2003/0008512 A1 | 1/2003 | Ali et al. |
| 2012/0112257 A1 | 5/2012 | Kato |
| 2016/0035394 A1 | 2/2016 | Zhang |
| 2016/0268264 A1 | 9/2016 | Hwang et al. |

THREE-DIMENSIONAL SEMICONDUCTOR DEVICE

CROSS-REFERENCE TO RELATED APPLICATIONS

This is a continuation application based on pending application Ser. No. 15/822,329, filed Nov. 27, 2017, the entire contents of which is hereby incorporated by reference.

Korean Patent Application No. 10-2017-0027776, filed on Mar. 3, 2017, and entitled, "Three-Dimensional Semiconductor Device," is incorporated by reference herein in its entirety.

BACKGROUND

1. Field

One or more embodiments relate to a three-dimensional semiconductor device.

2. Description of the Related Art

Many types of semiconductor devices have been developed. A two-dimensional (or planar) semiconductor device has a two-dimensional arrangement of memory cells. A three-dimensional (or vertical-type) semiconductor device has a three-dimensional arrangement of memory cells. Three-dimensional semiconductor devices were developed to overcome size, capacity, or other limitations of a two-dimensional semiconductor devices.

SUMMARY

In accordance with one or more embodiments, a three-dimensional (3D) semiconductor device includes a substrate having a cell array region and a peripheral circuit region; a cell array structure in the cell array region and including a 3D memory cell array; a peripheral logic structure in the peripheral circuit region and including a peripheral circuit transistor; a cell insulating layer to insulate the cell array structure; and a peripheral insulating layer insulated from the peripheral logic structure and the cell array region and having a porous layer.

In accordance with one or more other embodiments, a three-dimensional (3D) semiconductor device includes a substrate having a cell array region, a contact region, and a peripheral circuit region; a cell array structure in the cell array region and including a stacked structure and a vertical structure; a peripheral logic structure in the peripheral circuit region and including a peripheral circuit transistor; a contact wiring structure in the contact region and electrically connecting the cell array region and the peripheral circuit region; a cell insulating layer configured to insulate the cell array structure; a contact insulating layer to insulate the contact wiring structure; and a peripheral insulating layer that is insulated from the peripheral logic structure and the cell array region, the peripheral insulating layer including a low dielectric layer having a lower dielectric constant than a silicon oxide layer and a porous layer.

In accordance with one or more other embodiments, a three-dimensional (3D) semiconductor device includes a first region including a 3D cell array; a second region including a peripheral logic structure; and a first insulating layer in the second region and having a dielectric constant lower than silicon oxide, the first insulating layer between the peripheral logic structure and an area in the second region overlapping the peripheral logic structure.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
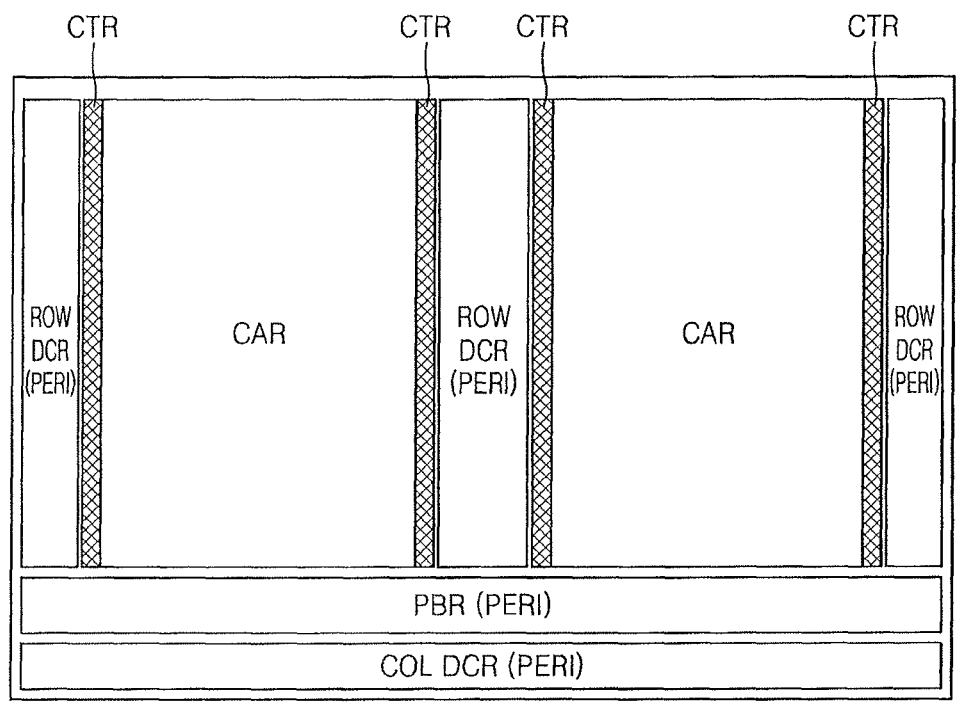
FIG. 1 illustrates an embodiment of a three-dimensional (3D) semiconductor device.
Figure 2:
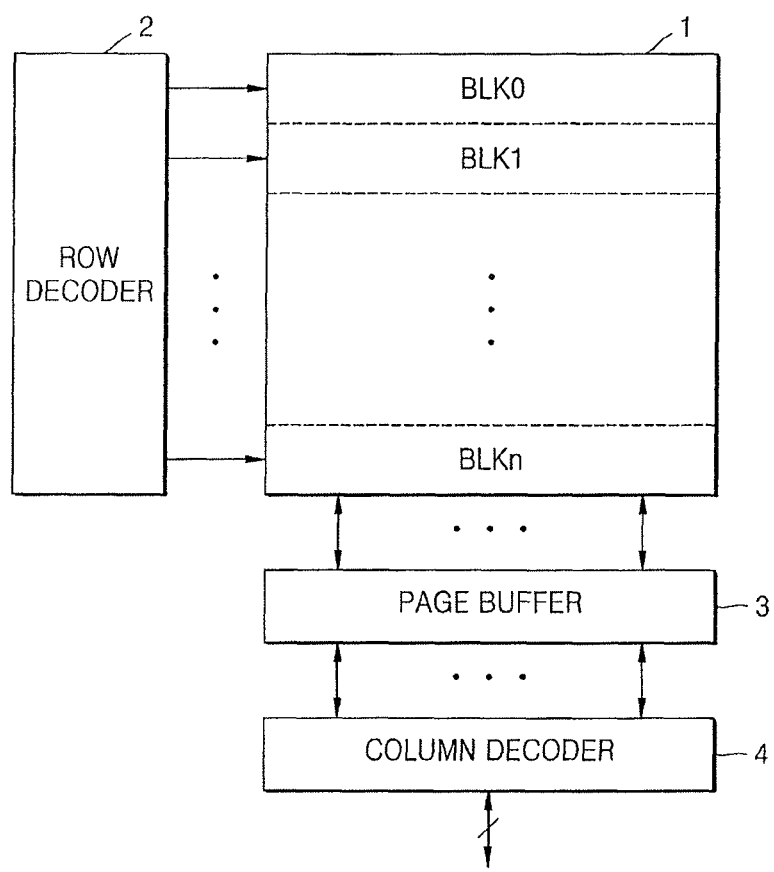
FIG. 2 illustrates a block diagram of the 3D semiconductor device of FIG. 1.

FIG. 1 is a plan view of an arrangement structure of a three-dimensional (3D) semiconductor device according to an example embodiment. FIG. 2 illustrates an embodiment of a block diagram of the 3D semiconductor device of FIG. 1.

The 3D semiconductor device may include a cell array region CAR and a peripheral circuit region PERI. The peripheral circuit region PERI may include row decoder regions ROW DCR, a page buffer region PBR, and a column decoder region COL DCR. A contact region CTR may be between the cell array region CAR and the row decoder regions ROW DCR.

A 3D memory cell array 1 includes a plurality of memory cells arranged in the cell array region CAR. The 3D memory cell array 1 may include a plurality of memory cells and a plurality of word lines and bit lines electrically connected to the memory cells. In an example embodiment, the 3D memory cell array 1 may include a plurality of memory blocks BLK0 to BLKn, which are data erase units.

A row decoder 2 for selecting word lines of the 3D memory cell array 1 is disposed in one of the row decoder regions ROW DCR. A contact wiring structure (peripheral contact wiring structure) for electrically connecting the 3D memory cell array 1 to the row decoder 2 may be in the contact region CTR. The row decoder 2 selects one of the memory blocks BLK0 to BLKn of the 3D memory cell array 1 according to address information and selects one of the word lines of the selected memory block. The row decoder 2 may provide a word line voltage (generated from a voltage generating circuit) to the selected word line and unselected word lines, respectively, based on control of a control circuit.

A page buffer region PBR may include a page buffer 3 for reading information stored in the memory cells. The page buffer 3 may temporarily store data to be stored in the memory cells, or sense data stored in the memory cells, depending on an operation mode. The page buffer 3 may operate as a write driver circuit in a program operation mode and as a sense amplifier circuit in a read operation mode.

A column decoder 4 is connected to the bit lines of the 3D memory cell array 1 and is in the column decoder region COL DCR. The column decoder 4 may provide a data transmission path between page buffer 3 and an external device, e.g., memory controller.

Figure 3:
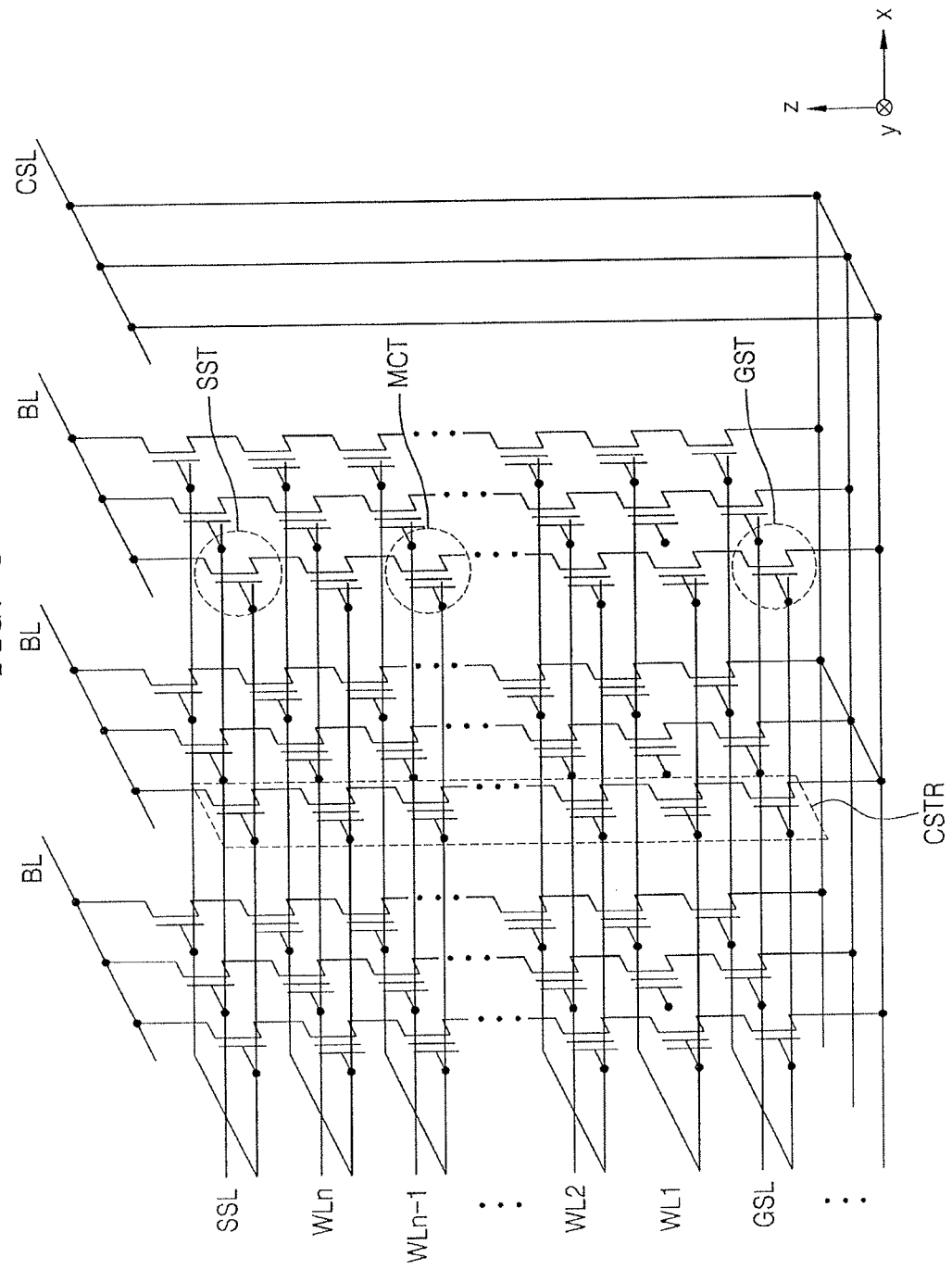
FIG. 3 illustrates an embodiment of a 3D memory cell array.

FIG. 3 illustrates a circuit embodiment of a 3D memory cell array of a 3D semiconductor device, for example, as illustrated in FIG. 1. The 3D memory cell array may include a common source line CSL, a plurality of bit lines BL, and a plurality of cell strings CSTR between the common source line CSL and the bit lines BL.

The bit lines BL are arranged in a two-dimensional pattern. The cell strings CSTR are connected in parallel to each of the bit lines BL. The cell strings CSTR may be connected in common to the common source line CSL. The cell strings CSTR may be between the bit lines BL and the common source line CSL. In an example embodiment, common source lines CSL may be arranged in a two-dimensional pattern. An identical voltage may be electrically applied to a plurality of common source lines CSL, or the common source lines CSL may be electrically controlled respectively by identical voltages.

Each of the cell strings CSTR may include a ground selection transistor GST connected to the common source line CSL, a string selection transistor SST connected to one of the bit lines BL, and a plurality of memory cell transistors MCT between the ground selection transistor GST and the string selection transistor SST. The ground selection transistor GST, the string selection transistor SST, and the memory cell transistors MCT may be connected to each other in series.

The common source line CSL may be connected in common to sources of a plurality of ground selection transistors GST. In addition, a ground selection line GSL, a plurality of word lines WL1 to WLn (n is a positive integer), and a plurality of string selection lines SSL between the common source line CSL and the bit lines BL may be used as gate electrodes of the ground selection transistors GST, the memory cell transistors MCT, and a plurality of string selection transistors SST, respectively. Each of the memory cell transistors MCT may include a data storage element.

Figure 4:
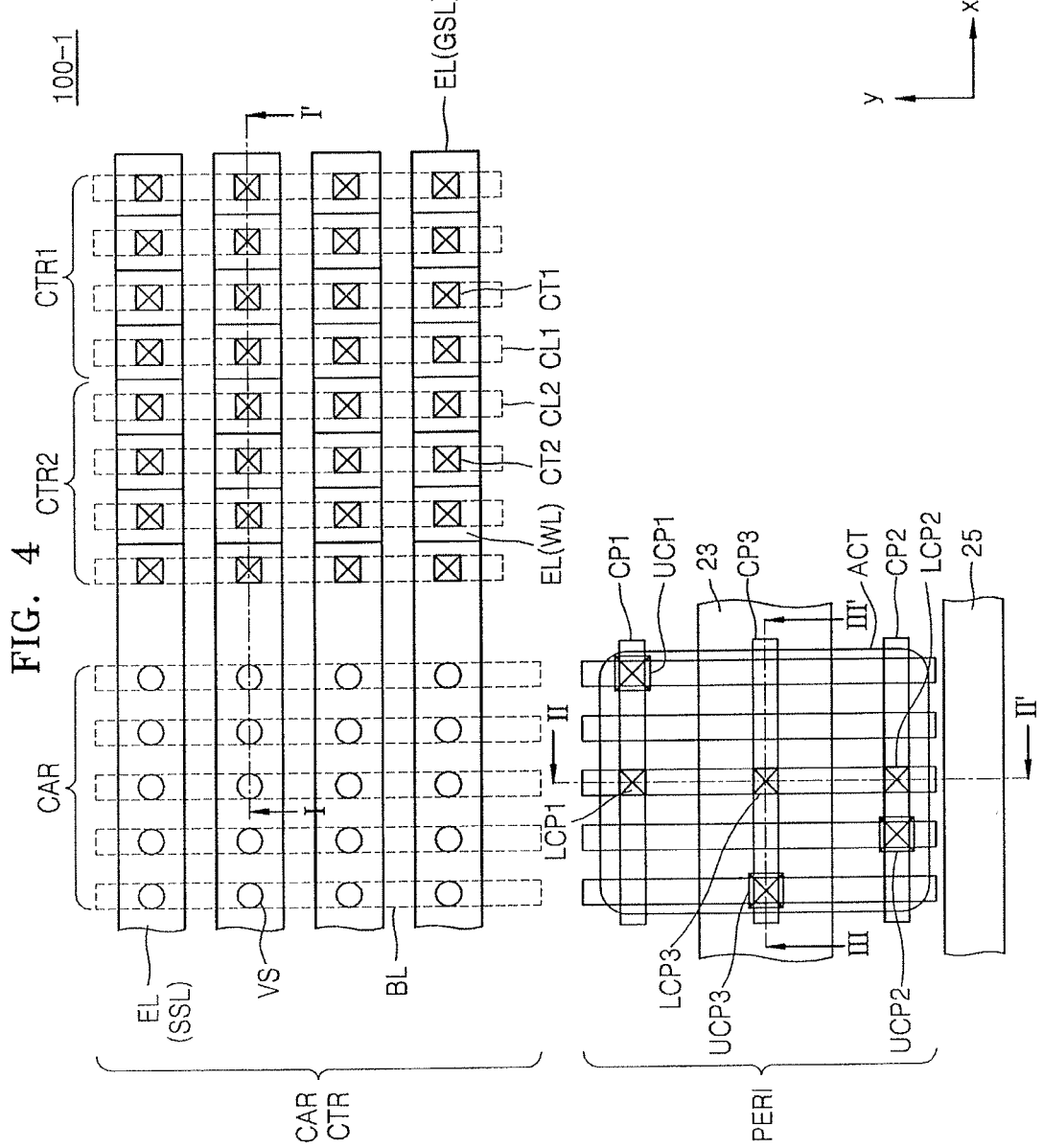
FIG. 4 illustrates a plant view of an embodiment of a 3D semiconductor device.
Figure 5:
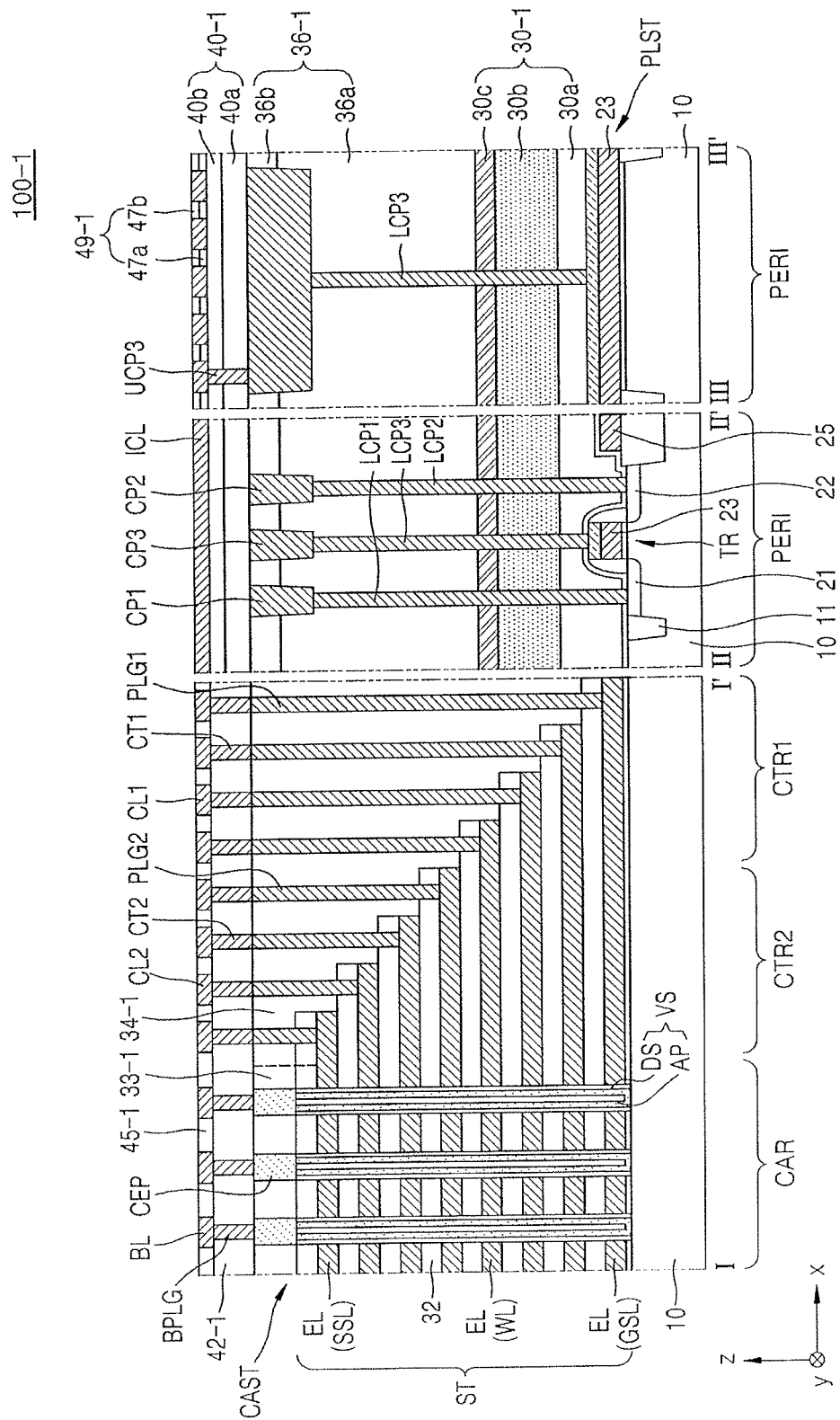
FIG. 5 illustrates a view taken along section lines I-I', and in FIG. 4.

FIG. 4 illustrates a plan view embodiment of a 3D semiconductor device 100-1, and FIG. 5 illustrates a cross-sectional view along lines I-I', II-II', and III-III' in FIG. 4.

The 3D semiconductor device 100-1 may include the cell array region CAR, the peripheral circuit region PERI, and the contact region CTR therebetween on a substrate 10. The contact region CTR may include a first contact region CTR1 adjacent to the peripheral circuit region PERI and a second contact region CTR2 adjacent to the cell array region CAR. The substrate 10 of the peripheral circuit region PERI may include an active region ACT defined by the device isolation layer 11.

The substrate 10 may be a silicon wafer. A cell array structure CAST may be on the substrate 10 of the cell array region CAR and a peripheral logic structure PLST may be on the substrate 10 of the peripheral circuit region PERI. The cell array structure CAST may extend from the cell array region CAR to the first and second contact regions CTR1 and CTR2. The height of the peripheral logic structure PLST may be lower than the height of the cell array structure CAST.

The cell array structure CAST may include a stacked structure ST including electrodes EL vertically stacked on the substrate 10 and vertical structures VS penetrating through the stacked structure ST. A cell pad CEP may be formed on a vertical structure VS. The stacked structure ST may have a line-like structure extending in a first direction (x-direction) as shown.

In an example embodiment, the stacked structure ST may have a planar structure covering the whole cell array region CAR. The stacked structure ST may have a stepwise structure in the first and second contact regions CTR1 and CTR2 for electrical connection between the electrodes EL and the peripheral logic structure PLST. A vertical height of the stacked structure ST in the first and second contact regions CTR1 and CTR2 may gradually increase toward the cell array region CAR. For example, the stacked structure ST may have a profile of a slope in the first and second contact regions CTR1 and CTR2.

The stacked structure ST may include the electrodes EL vertically stacked on the substrate 10 and electrode isolation insulating layers 32 between vertically adjacent electrodes EL. The electrodes EL may include doped silicon, a metal (e.g., tungsten), a metal nitride, metal silicides, or combinations thereof.

Thicknesses of the electrode isolation insulating layers 32 may be uniform or different. Each of the electrode isolation insulating layers 32 may be a silicon oxide layer. End portions of the electrodes EL may have a stepwise structure on the first and second contact regions CTR1 and CTR2. The areas of the electrodes EL may be reduced as the electrodes EL are further away from an upper surface of the substrate 10. Sidewalls of the electrodes EL may be at different horizontal positions in the first and second contact regions CTR1 and CTR2.

The vertical structures VS may be connected to the substrate 10 through the stacked structure ST. The vertical structures VS may include a semiconductor material or a conductive material. The vertical structures VS may include a vertical column AP connected to the substrate 10 and an information storage element DS between the vertical column AP and the electrodes EL.

The vertical structures VS may include silicon or silicon germanium doped with impurity ions of a first conductivity type. The vertical structures VS may have inner holes having a hollow cylindrical shape (e.g., a macaroni shape). A filling insulating layer (e.g., a silicon oxide layer) may fill the inner holes of the vertical structures VS.

In an example embodiment, the vertical structures VS may be arranged in one direction, e.g., a second direction (y-direction) in a plan view in FIG. 4. In an example embodiment, the vertical structures VS may be in a zigzag formation in one direction, e.g., the second direction (y-direction) in a plan view.

In an example embodiment, a cell insulating layer 33-1 and a contact insulating layer 34-1 respectively cover the cell array structure CAST and the first and second contact regions CTR1 and CTR2 and may be arranged on the entire surface of the substrate 10 (see, e.g., FIG. 5). The cell insulating layer 33-1 and the contact insulating layer 34-1 may have a planarized upper surface. The contact insulating layer 34-1 may cover end portions of a plurality of stacked structures ST.

Contact wiring structures PLG1 and PLG2 electrically connect the cell array structure CAST of the cell array region CAR and the peripheral logic structure PLST of the peripheral circuit region PERI to the first and second contact regions CTR1 and CTR2. For example, first plugs PLG1 may be in the first contact region CTR1 and connected to ends of electrodes EL through the contact insulating layer 34-1 to form a contact wiring structure. Second plugs PLG2 may be in the second contact region CTR2 and connected to ends of electrodes EL through the contact insulating layer 34-1 to form a contact wiring structure.

The cell insulating layer 33-1 may be, for example, a silicon oxide layer. The contact insulating layer 34-1 may be a low dielectric layer having a lower dielectric constant than the silicon oxide layer. When the contact insulating layer 34-1 includes a low dielectric layer, parasitic capacitance between the first and second plugs PLG1 and PLG2 may be reduced, which, in turn, may reduce signal delay of a 3D semiconductor device.

The vertical length of the first plugs PLG1 may be reduced toward the cell array region CAR. The vertical length of the second plugs PLG2 may be reduced toward the cell array region CAR. In one embodiment, the minimum vertical length of the first plugs PLG1 may be greater than the maximum vertical length of the second plugs PLG2. Upper surfaces of the first and second plugs PLG1 and PLG2 may be flush with each other.

Bit lines BL extending in the second direction (y-direction) across the stacked structure ST may be arranged on an upper portion of the cell array structure CAST. The bit lines BL may be electrically connected to the vertical structures VS via a bit line contact plug BPLG and the cell pad CEP. The bit line contact plug BPLG may be insulated by a lower wiring insulating layer 42-1. The bit lines BL may be insulated by an upper wiring insulating layer 45-1.

First connection lines CL1 may be on the contact insulating layer 34-1 of the first contact region CTR1 and electrically connected to the first plugs PLG1 through first contacts CT1. Second connection lines CL2 may be on the contact insulating layer 34-1 of the second contact region CTR2 and electrically connected to the second plugs PLG2 through second contacts CT2.

The first and second plugs PLG1 and PLG2 may be insulated by the lower wiring insulating layer 42-1. The first connection lines CL1 and second connection lines CL2 may be insulated by the upper wiring insulating layer 45-1. The lower wiring insulating layer 42-1 and upper wiring insulating layer 45-1 may include, for example, a silicon oxide layer.

The peripheral logic structure PLST of the peripheral circuit region PERI may include row and column decoders, page buffers, and control circuits. The peripheral logic structure PLST may include transistors TR, a resistor, and a capacitor electrically connected to the cell array structure CAST. The device isolation layer 11 may define the active region ACT and may be formed in the substrate 10 of the peripheral circuit region PERI.

For example, the peripheral logic structure PLST of the peripheral circuit region PERI may include a transistor TR having a peripheral word line 23 (or peripheral gate electrode) extending in the first direction across the active area ACT, and source and drain impurity regions 21 and 22 in the active region ACT on sides of the peripheral word line 23. In addition, the peripheral logic structure PLST may include a resistance pattern 25.

The peripheral circuit region PERI includes a peripheral lower insulating layer 30-1 covering the peripheral logic structure PLST. The peripheral lower insulating layer 30-1 may cover the peripheral word line 23 and the resistance pattern 25. An upper surface of the peripheral lower insulating layer 30-1 may be below an upper surface of the cell array structure CAST.

The peripheral lower insulating layer 30-1 may be, for example, a triple layer including a silicon oxide layer 30a, a low dielectric layer 30b having a lower dielectric constant than the silicon oxide layer 30a, and a porous layer 30c. The porous layer 30c may also have a lower dielectric constant lower than the silicon oxide layer 30a. The low dielectric layer 30b may include, for example, a fluorine-doped silicon oxide, a carbon-doped silicon oxide, or a spin-on silicon-based polymer.

The fluorine-doped silicon oxide may be, for example, SiOF. The carbon-doped silicon oxide may be, for example, SiOC. Examples of the spin-on silicon-based polymer include hydrogen silsesquioxane (HSQ), methyl silsesquioxane (MSQ), a poly-tetrafluoroethylene (PTFE) layer, fluorinated poly-aryl-ether (FLARE), poly-para-xylylene, benzocyclobutene (BCB), and silicon low-K polymer (SILK). The low dielectric layer 30b may include various materials having a lower dielectric constant than the silicon oxide layer 30a in addition to the aforementioned materials.

The porous layer 30c may be, for example, a porous material layer. The porous layer 30c may be, for example, a silicon carbon nitride (SiCN) layer. The porous layer 30c may be a material layer (e.g., a second material layer) having porosity in addition to the SiCN layer. Materials of a low dielectric layer and a porous layer in the following description may be the same as those described above.

When the peripheral lower insulating layer 30-1 includes the low dielectric layer 30b or the porous layer 30c, parasitic capacitance between conductive lines in the peripheral circuit region PERI (e.g., peripheral word line 23, resistance pattern 25, and first, second, and third lower contact plugs LCP1, LCP2, and LCP3) may be reduced in order to reduce signal delay of a 3D semiconductor device.

When the peripheral lower insulating layer 30-1 includes the porous layer 30c, adhesive characteristics between the porous layer 30c and a low dielectric layer 36a of a peripheral upper insulating layer 36-1 may be improved. When the peripheral lower insulating layer 30-1 includes the porous layer 30c, the porous layer 30c may have a hydrogen adsorption function and may contribute to improving electrical characteristics of the 3D semiconductor device 100-1.

A plurality of wiring lines ICL may be on the peripheral circuit region PERI. In an example embodiment, first to third contact pads CP1, CP2, and CP3 may be between the peripheral word line 23 and the wiring lines ICL in a vertical view. The first to third contact pads CP1 to CP3 extend in the first direction (the x-direction) and may be horizontally spaced apart from each other in the second direction (the y-direction). The first to third contact pads CP1 to CP3 are on the active region ACT and lengths of first to third contact pads CP1 to CP3 may be greater than a width of the active region ACT in the first direction.

According to an example embodiment, upper surfaces of the first to third contact pads CP1 to CP3 may be substantially flush (or even) with the upper surface of the first and second plugs PLG1 and PLG2 on the first and second contact regions CTR1 and CTR2. The upper surfaces of the first to third contact pads CP1 to CP3 may be substantially flush with the upper surface of the vertical structures VS of the cell array region CAR.

The first contact pad CP1 may be electrically connected to the source impurity region 21 through the first lower contact plug LCP1. The second contact pad CP2 may be electrically connected to the drain impurity region 22 through the second lower contact plug LCP2. The third contact pad CP3 may be electrically connected to the peripheral word line 23 through the third lower contact plug LCP3.

The first to third lower contact plugs LCP1 to LCP3 may be within the active area ACT irrespective of the arrangement of the wiring lines ICL. The first to third lower contact plugs LCP1, LCP2, LCP3 may be on an identical line extending in the second direction.

The first to third contact pads CP1 to CP3 and the first to third lower contact plugs LCP1 to LCP3 may be insulated by the peripheral upper insulating layer 36-1. The peripheral upper insulating layer 36-1 may include the low dielectric layer 36a on the peripheral lower insulating layer 30-1 and a porous layer 36b on low dielectric layer 36a.

When the peripheral upper insulating layer 36-1 includes the low dielectric layer 36a and the porous layer 36b, parasitic capacitance between the first to third contact pads CP1 to CP3 and the first to third lower contact plugs LCP1 to LCP3 may be reduced in the peripheral circuit region PERI, which, in turn, may reduce signal delay of the 3D semiconductor device.

When the peripheral upper insulating layer 36-1 includes the porous layer 36b, adhesive characteristics between the porous layer 36b and a low dielectric layer 40a of a peripheral lower wiring insulating layer 40-1 may be improved. In addition, when the peripheral upper insulating layer 36-1 includes the porous layer 36b, the porous layer 36b may have a hydrogen adsorption function and may contribute to improving electrical characteristics of a 3D semiconductor device.

The first to third contact pads CP1 to CP3 are illustrated to be in the peripheral circuit region PERI. In one embodiment, at least one of the first to third contact pads CP1 to CP3 may be omitted and more contact pads may be added.

Each of the first to third contact pads CP1 to CP3 may be electrically connected to one of the wiring lines ICL through first to third upper contact plugs UCP1, UCP2, and UCP3. In an example embodiment, the first to third upper contact plugs UCP1 to UCP3 may correspond to the first to third contact pads CP1 to CP3, respectively. Positions of the first to third upper contact plugs UCP1 to UCP3 may vary depending on an electrical connection relationship between the wiring lines ICL and peripheral logic circuits.

Upper surfaces of the first to third upper contact plugs UCP1 to UCP3 may be substantially flush with upper surfaces of the first and second contacts CT1 and CT2 of the first and second contact regions CTRL and CTR2. The first to third upper contact plugs UCP1 to UCP3 may be electrically connected to a peripheral logic structure through the first to third contact pads CP1 to CP3, respectively.

The first to third upper contact plugs UCP1 to UCP3 may be insulated by the peripheral lower wiring insulating layer 40-1. The peripheral lower wiring insulating layer 40-1 may include the low dielectric layer 40a and a porous layer 40b on the low dielectric layer 40a.

When the peripheral lower wiring insulating layer 40-1 includes the low dielectric layer 40a and the porous layer 40b, parasitic capacitance between the first to third upper contact plugs UCP1 to UCP3 may be reduced in the peripheral circuit region PERI, which, in turn, may reduce signal delay of a 3D semiconductor device.

When the peripheral lower wiring insulating layer 40-1 includes the porous layer 40b, adhesive characteristics between the porous layer 40b and a low dielectric layer 47a of a peripheral upper wiring insulating layer 49-1 may be improved. In addition, when the peripheral lower wiring insulating layer 40-1 includes the porous layer 40b, the porous layer 40b may have a hydrogen adsorption function and may contribute to improving electrical characteristics of the 3D semiconductor device 100-1.

A plurality of wiring lines ICL connected to the first to third upper contact plugs UCP1 to UCP3 may be arranged on the peripheral circuit region PERI. The wiring lines ICL may extend from the peripheral circuit region PERI to the cell array region CAR. In an example embodiment, the wiring lines ICL may include the same conductive material as bit lines of the cell array region CAR.

The wiring lines ICL may extend in parallel in the second direction perpendicular to the first direction. Some of the wiring lines ICL may overlap the active area ACT in a plan view, e.g., the wiring lines ICL may be on one active area ACT.

The wiring lines ICL may be insulated by the peripheral upper wiring insulating layer 49-1. When the peripheral upper wiring insulating layer 49-1 includes the low dielectric layer 47a and a porous layer 47b, parasitic capacitance between the wiring lines ICL may be reduced in the peripheral circuit region PERI, which, in turn, may reduce signal delay of the 3D semiconductor device 100-1.

When the peripheral upper wiring insulating layer 49-1 includes the porous layer 47b, adhesive characteristics between material layers formed after the porous layer 47b may be improved. In addition, when the peripheral upper wiring insulating layer 49-1 includes the porous layer 47b, the porous layer 47b may have a hydrogen adsorption function and may contribute to improving electrical characteristics of 3D semiconductor device 100-1.

Figure 6:
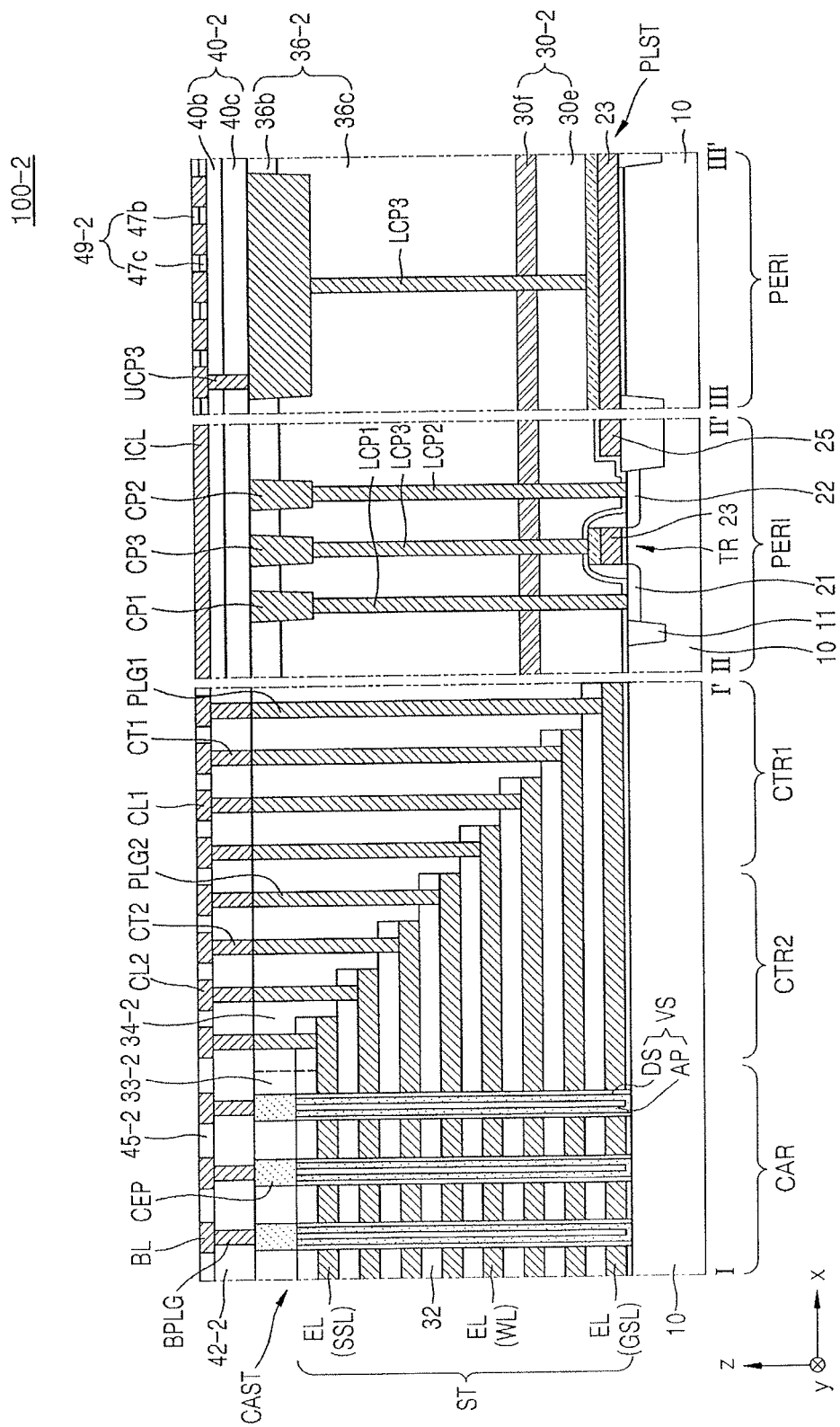
FIG. 6 illustrates another embodiment of a 3D semiconductor device.

FIG. 6 illustrates another embodiment of 3D semiconductor device 100-2. The 3D semiconductor device 100-2 of FIG. 6 may be a cross-sectional view taken along lines I-I', II-II', and III-III' in FIG. 4. The 3D semiconductor device 100-2 of FIG. 6 may be the same as the 3D semiconductor device 100-1 of FIG. 5, except for the configuration of a cell insulating layer 33-2, a contact insulating layer 34-2, a lower wiring insulating layer 42-2, an upper wiring insulating layer 45-2, a peripheral lower insulating layer 30-2, a peripheral upper insulating layer 36-2, a peripheral lower wiring insulating layer 40-2, and a peripheral upper wiring insulating layer 49-2.

The 3D semiconductor device 100-2 may include the cell insulating layer 33-2 and the contact insulating layer 34-2 respectively covering the cell array structure CAST of the cell array region CAR and the first and second contact regions CTR1 and CTR2. The cell insulating layer 33-2 may be a low dielectric layer having a lower dielectric constant than a silicon oxide layer. The contact insulating layer 34-2 may be a silicon oxide layer. When the cell insulating layer 33-2 includes a low dielectric layer, parasitic capacitance between cell pads CEP may be reduced to improve signal delay.

The bit line contact plug BPLG of the 3D semiconductor device 100-2 may be insulated by the lower wiring insulating layer 42-2. The bit lines BL may be insulated by the upper wiring insulating layer 45-2. The first and second plugs PLG1 and PLG2 of the 3D semiconductor device 100-2 may be insulated by the lower wiring insulating layer 42-2. The first connection lines CL1 and the second connection lines CL2 may be insulated by the upper wiring insulating layer 45-2.

The lower wiring insulating layer 42-2 and the upper wiring insulating layer 45-2 may include a low dielectric layer having a lower dielectric constant than a silicon oxide layer. When the lower wiring insulating layer 42-2 and the upper wiring insulating layer 45-2 include a low dielectric layer, parasitic capacitance between a plurality of bit line contact plugs BPLG, the first and second plugs PLG1 and PLG2, the bit lines BL, and the first and second connection lines CL1 and CL2 may be reduced, which, in turn, may reduce signal delay of the 3D semiconductor device 100-2.

The 3D semiconductor device 100-2 may include the peripheral lower insulating layer 30-2 covering the peripheral word line 23 and the resistance pattern 25 of the peripheral circuit region PERI. The peripheral lower insulating layer 30-2 may include a first material layer 30e including a silicon oxide layer or a low dielectric layer and a porous second material layer 30f on the first material layer 30e.

When the peripheral lower insulating layer 30-2 includes the first material layer 30e including a low dielectric layer or a porous layer, parasitic capacitance between conductive lines in the peripheral circuit region PERI (e.g., peripheral word line 23, resistance pattern 25, and first to third lower contact plugs LCP1 to LCP3) may be reduced. This, in turn, may reduce signal delay of the 3D semiconductor device 100-2.

When the peripheral lower insulating layer 30-2 includes the porous second material layer 30f, adhesive characteristics between the porous second material layer 30f and a silicon oxide layer 36c of the peripheral upper insulating layer 36-2 may be improved. In addition, when the peripheral lower insulating layer 30-2 includes the porous second material layer 30f, the porous second material layer 30f may have a hydrogen adsorption function and may contribute to improving electrical characteristics of the 3D semiconductor device 100-2.

The 3D semiconductor device 100-2 may include peripheral upper insulating layer 36-2 on peripheral lower insulating layer 30-2 in the peripheral circuit region PERI. The peripheral upper insulating layer 36-2 may include the silicon oxide layer 36c on the peripheral lower insulating layer 30-2 and a porous layer 36b on the silicon oxide layer 36c.

When the peripheral upper insulating layer 36-2 includes the porous layer 36b, adhesive characteristics between the porous layer 36b and a silicon oxide layer 40c of the peripheral lower wiring insulating layer 40-2 may be improved. In addition, when the peripheral upper insulating layer 36-2 includes the porous layer 36b, the porous layer 36b may have a hydrogen adsorption function and may contribute to improving electrical characteristics of the 3D semiconductor device 100-2.

In the 3D semiconductor device 100-2, the first to third upper contact plugs UCP1 to UCP3 may be insulated by the peripheral lower wiring insulating layer 40-2 in the peripheral circuit region PERI. The peripheral lower wiring insulating layer 40-2 may include the silicon oxide layer 40c and a porous layer 40b on the silicon oxide layer 40c.

When the peripheral lower wiring insulating layer 40-2 includes the porous layer 40b, adhesive characteristics between the porous layer 40b and a silicon oxide layer 47c of the peripheral upper wiring insulating layer 49-2 may be improved. In addition, when the peripheral lower wiring insulating layer 40-2 includes a silicon porous layer 40b, the silicon porous layer 40b may have a hydrogen adsorption function and may contribute to improving electrical characteristics of the 3D semiconductor device 100-2.

In the 3D semiconductor device 100-2, the wiring lines ICL may be insulated by the peripheral upper wiring insulating layer 49-2 in the peripheral circuit region PERI. When the peripheral upper wiring insulating layer 49-2 includes porous layer 47b, adhesive characteristics between material layers formed after the porous layer 47b may be improved.

In addition, when the peripheral upper wiring insulating layer 49-2 includes porous layer 47b, the porous layer 47b may have a hydrogen adsorption function and may contribute to improving electrical characteristics of the 3D semiconductor device 100-2.

Figure 7:
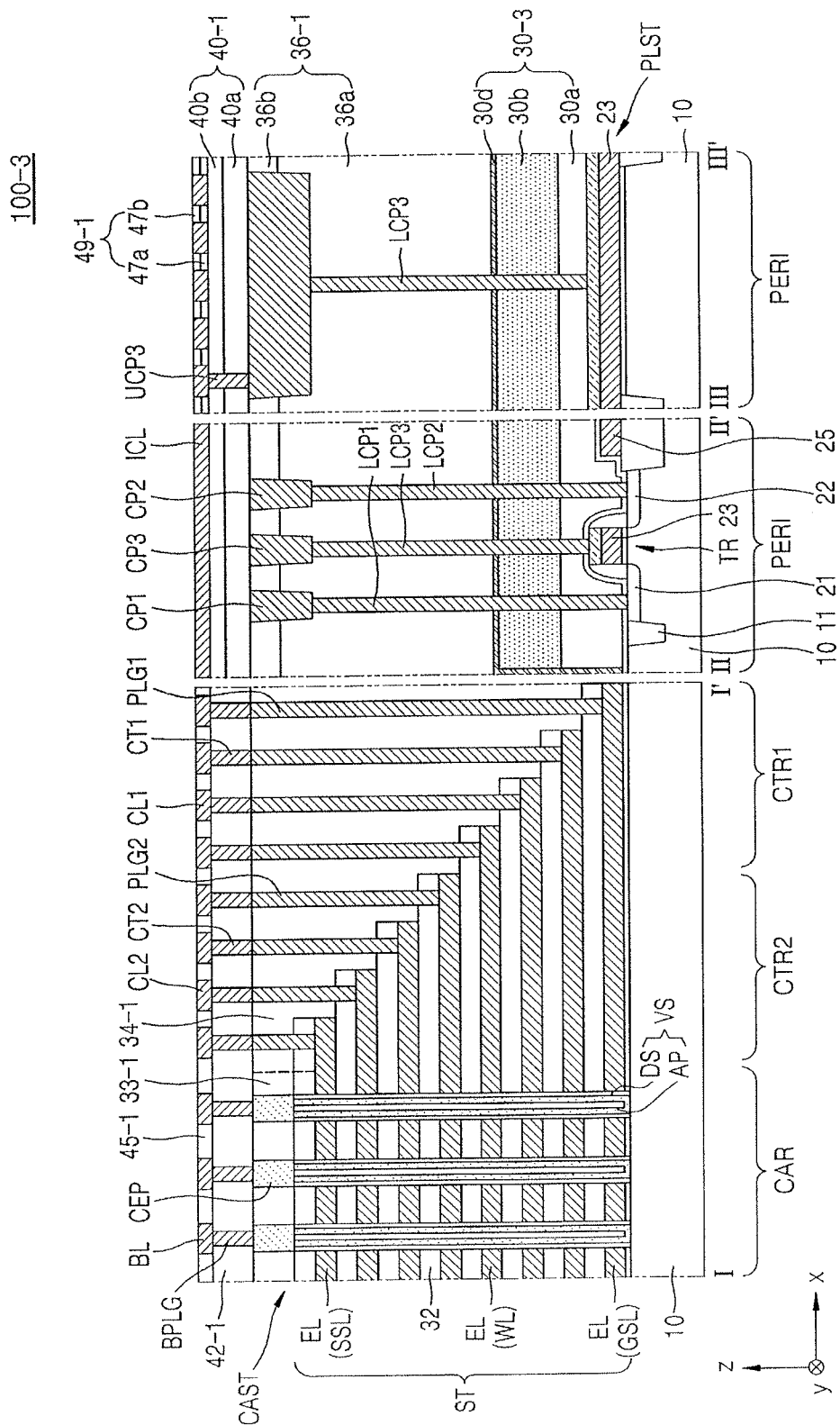
FIG. 7 illustrates another embodiment of a 3D semiconductor device.

FIG. 7 illustrates a cross-sectional view of another embodiment of a 3D semiconductor device 100-3. The 3D semiconductor device 100-3 of FIG. 7 may be a cross-sectional view taken along lines I-I', II-II', and in FIG. 4. The 3D semiconductor device 100-3 of FIG. 7 may be the same as the 3D semiconductor device 100-1 of FIG. 5, except for the configuration of a peripheral lower insulating layer 30-3.

The 3D semiconductor device 100-3 may include the peripheral lower insulating layer 30-3 covering the peripheral word line 23 and the resistance pattern 25 of the peripheral circuit region PERI. The peripheral lower insulating layer 30-3 may be a triple layer including the silicon oxide layer 30a covering the peripheral word line 23 and the resistance pattern 25, the low dielectric layer 30b on the silicon oxide layer 30a and having a lower dielectric constant than the silicon oxide layer 30a, and a protective layer 30d on an upper surface and a sidewall of the silicon oxide layer 30a and the low dielectric layer 30b. The protective layer 30d may be a double layer including a low dielectric layer and a porous layer. The protective layer 30d may protect one sidewall of peripheral circuit region PERI.

When the peripheral lower insulating layer 30-3 includes the low dielectric layer 30b and the protective layer 30d including the low dielectric layer 30b, parasitic capacitance between conductive lines in the peripheral circuit region PERI (e.g., peripheral word line 23, resistance pattern 25, and first to third lower contact plugs LCP1 to LCP3) may be reduced, in order to reduce signal delay of the 3D semiconductor device 100-3.

When the peripheral lower insulating layer 30-3 includes a porous protective layer 30d, adhesive characteristics between the porous protective layer 30d and the low dielectric layer 36a of the peripheral upper insulating layer 36-1 may be improved. In addition, when the peripheral lower insulating layer 30-3 includes the porous protective layer 30d, the porous protective layer 30d may have a hydrogen adsorption function and may contribute to improving electrical characteristics of the 3D semiconductor device 100-3.

Figure 8:
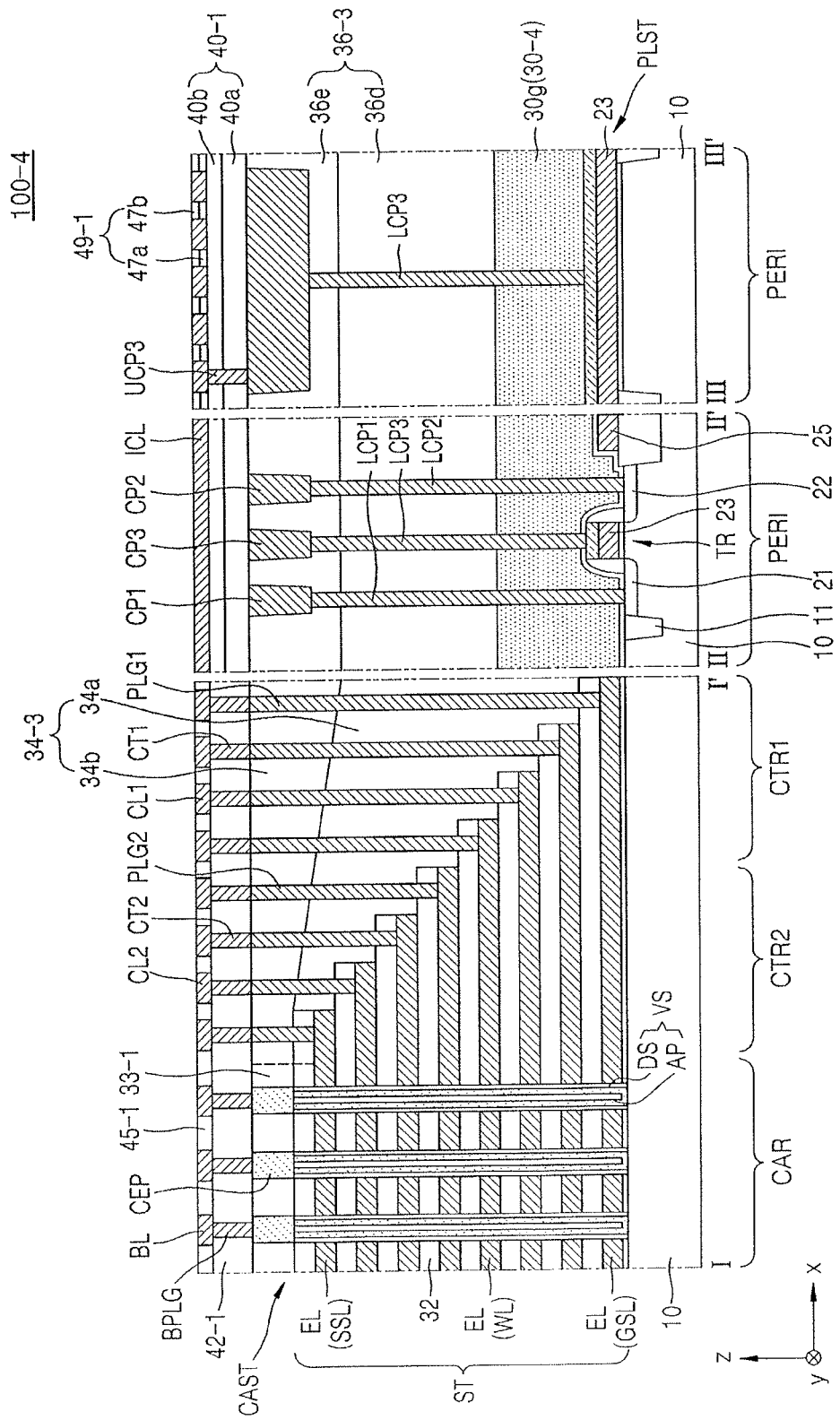
FIG. 8 illustrates another embodiment of a 3D semiconductor device.

FIG. 8 illustrates a cross-sectional view of another embodiment of a 3D semiconductor device 100-4. The 3D semiconductor device 100-4 of FIG. 8 may be a cross-sectional view taken along lines I-I', II-II', and in FIG. 4. The 3D semiconductor device 100-4 of FIG. 8 may be the same as the 3D semiconductor devices 100-1 and 100-2 of FIGS. 5 and 6, except for the configuration of a contact insulating layer 34-3, a peripheral lower insulating layer 30-4, and a peripheral upper insulating layer 36-3.

The 3D semiconductor device 100-4 may include the contact insulating layer 34-3 covering the first and second contact regions CTR1 and CTR2 of the cell array region CAR. The contact insulating layer 34-3 may include a silicon oxide layer 34a and a porous layer 34b. The silicon oxide layer 34a may be inclined from the cell array region CAR to the peripheral circuit region PERI. The porous layer 34b is on the silicon oxide layer 34a and may be flush with the cell pad CEP and the first to third contact pads CP1 to CP3 of the peripheral circuit region PERI.

When the contact insulating layer 34-3 includes the porous layer 34b, signal delay may be reduced by reducing parasitic capacitance between the first and second plugs PLG1 and PLG2. Thus, adhesive characteristics between the porous layer 34b and the lower wiring insulating layer 42-1 may be improved. In addition, when the contact insulating layer 34-3 includes the porous layer 34b, the porous layer 34b may have a hydrogen adsorption function and may contribute to improving electrical characteristics of the 3D semiconductor device 100-4.

The 3D semiconductor device 100-4 may include the peripheral lower insulating layer 30-4 covering the peripheral word line 23 and the resistance pattern 25 of the peripheral circuit region PERI. The peripheral lower insulating layer 30-4 may include a low dielectric layer 30g having a lower dielectric constant than the silicon oxide layer. When the peripheral lower insulating layer 30-4 includes the low dielectric layer 30g, parasitic capacitance between conductive lines in the peripheral circuit region PERI (e.g., peripheral word line 23, resistance pattern 25, and first to third lower contact plugs LCP1 to LCP3) may be reduced. This, in turn, may reduce signal delay of the 3D semiconductor device 100-4.

The 3D semiconductor device 100-4 may include the peripheral upper insulating layer 36-3 on the peripheral lower insulating layer 30-4 in the peripheral circuit region PERI. The peripheral upper insulating layer 36-3 may include a silicon oxide layer 36d on the peripheral lower insulating layer 30-4 and a porous layer 36e on the silicon oxide layer 36d. The thickness of the silicon oxide layer 36d may be less than the thickness of the silicon oxide layer 36c of FIG. 6. The thickness of the porous layer 36e may be greater than the thickness of the porous layer 36b of FIG. 5.

When the peripheral upper insulating layer 36-3 includes the porous layer 36e, parasitic capacitance between the first to third contact pads CP1 to CP3 may be reduced to improve adhesive characteristics between the porous layer 36e and the low dielectric layer 40a of the peripheral lower wiring insulating layer 40-1. In addition, when the peripheral upper insulating layer 36-3 includes the porous layer 36e, the porous layer 36e may have a hydrogen adsorption function and may contribute to improving electrical characteristics of the 3D semiconductor device 100-4.

Figure 9:
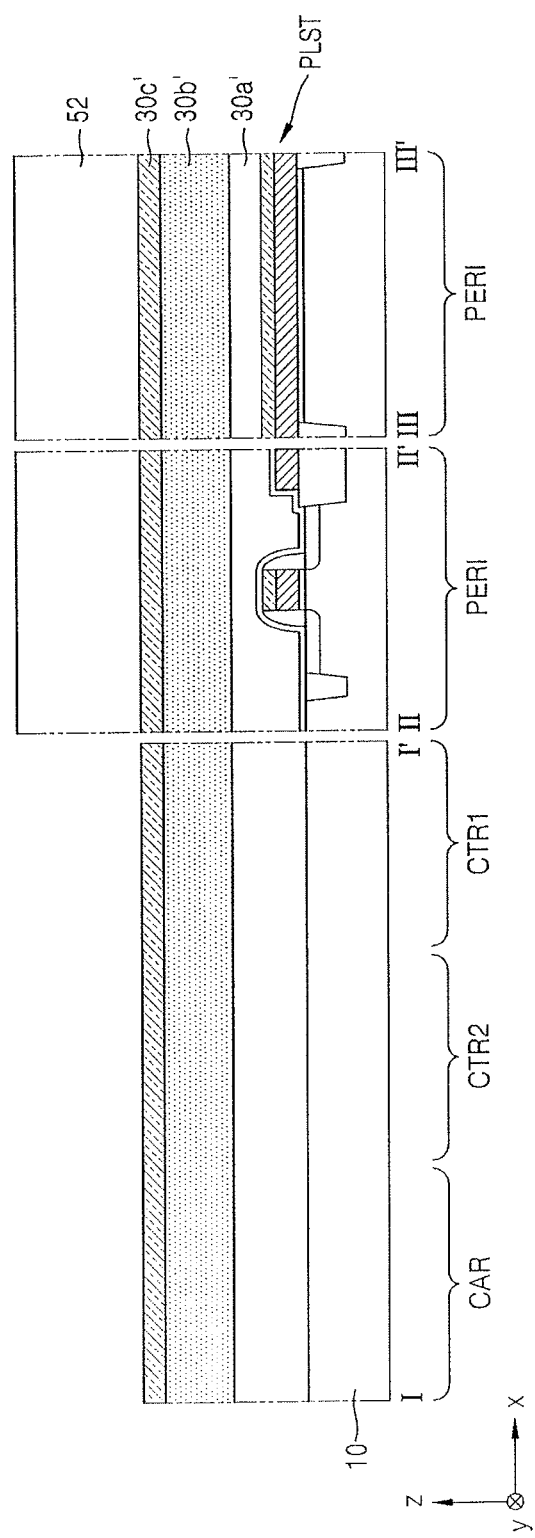
FIGS. 9 and 10 illustrate an embodiment of views for explaining a method for manufacturing a 3D semiconductor device.
Figure 10:
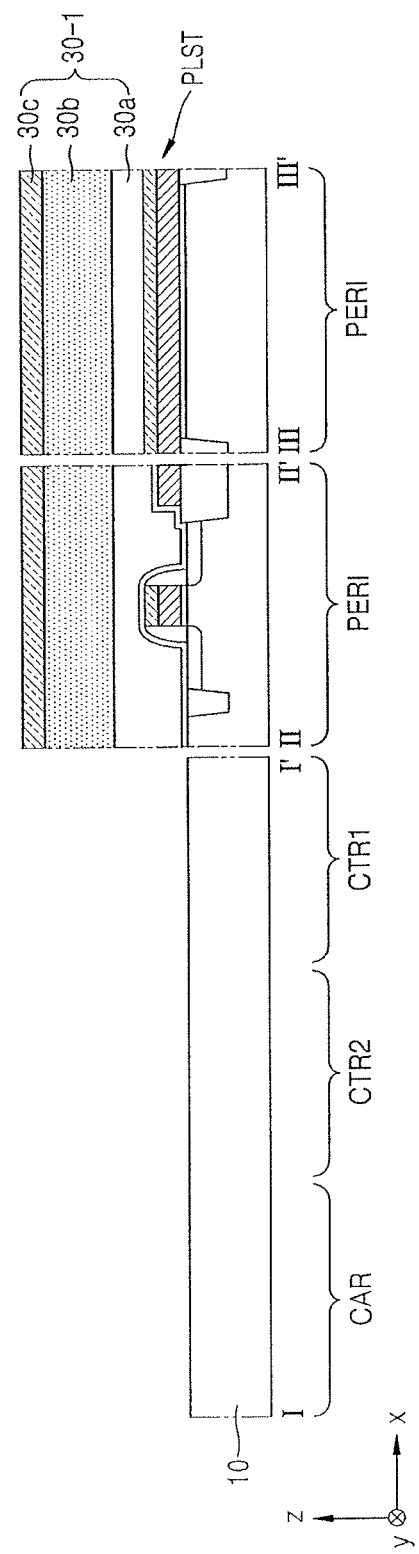

FIGS. 9 and 10 illustrate partial cross-sectional views for explaining an embodiment of a method for manufacturing a 3D semiconductor device. FIGS. 9 and 10 may explain the method of manufacturing peripheral lower insulating layer 30-1 of FIG. 5.

Referring to FIG. 9, the peripheral logic structure PLST is on the peripheral circuit region PERI of the substrate 10. The peripheral logic structure PLST may include the peripheral word line 23 (or a peripheral gate electrode), transistors including the source and drain impurity regions 21 and 22, the resistance pattern 25, and the like as described with reference to FIG. 5. The device isolation layer 11 defining the active region ACT may be formed in the substrate 10 of the peripheral circuit region PERI.

Subsequently, a silicon oxide layer 30a', a low dielectric layer 30b', and a porous layer 30e' may completely cover the cell array region CAR, the first and second contact regions CTR1 and CTR2, and the peripheral circuit region PERI on the substrate 10 in this order. The porous layer 30c' may reduce parasitic capacitance and improve adhesive characteristics with a subsequent layer. The porous layer 30c' may compensate for poor adhesive characteristics of the low dielectric layer 30b'. Next, a photoresist pattern 52 is formed on the porous layer 30c' of the peripheral circuit region PERI using a photolithography process.

Referring to FIG. 10, the silicon oxide layer 30a', the low dielectric layer 30b', and the porous layer 30c' of the cell array region CAR and the first and second contact regions CTR1 and CTR2 are selectively etched, with the photoresist pattern 52 (of FIG. 9) as an etching mask, to expose the substrate 10 of the cell array region CAR and the first and second contact regions CTR1 and CTR2.

Then, the photoresist pattern 52 (of FIG. 9) is removed. As a result, the peripheral lower insulating layer 30-1 including the silicon oxide layer 30a, the low dielectric layer 30b, and the porous layer 30c may be formed in the peripheral circuit region PERI.

During the process of forming the silicon oxide layer 30a, the low dielectric layer 30b, and the porous layer 30c constituting the peripheral lower insulating layer 30-1, the peripheral lower insulating layer 30-2 of FIG. 6 may be formed when the silicon oxide layer 30a' or the low dielectric layer 30b' is not formed. During the process of forming the silicon oxide layer 30a, the low dielectric layer 30b, and the porous layer 30c constituting the peripheral lower insulating layer 30-1, the peripheral lower insulating layer 30-4 of FIG. 8 may be formed when the silicon oxide layer 30a' or the porous layer 30c' is not formed.

Subsequently, the cell array structure CAST and the first and second plugs PLG1 and PLG2 are formed in the cell array region CAR and the first and second contact regions CTR1 and CTR2 as described with reference to FIG. 5. The first to third contact pads CP1 to CP3 and the first to third lower contact plugs LCP1 to LCP3 are formed in the peripheral circuit region PERI. Next, the bit lines BL, the connection lines CL1 and CL2, and the wiring lines ICL may be formed in the cell array region CAR, the first and second contact regions CTR1 and CTR2, and the peripheral circuit region PERI.

Figure 11:
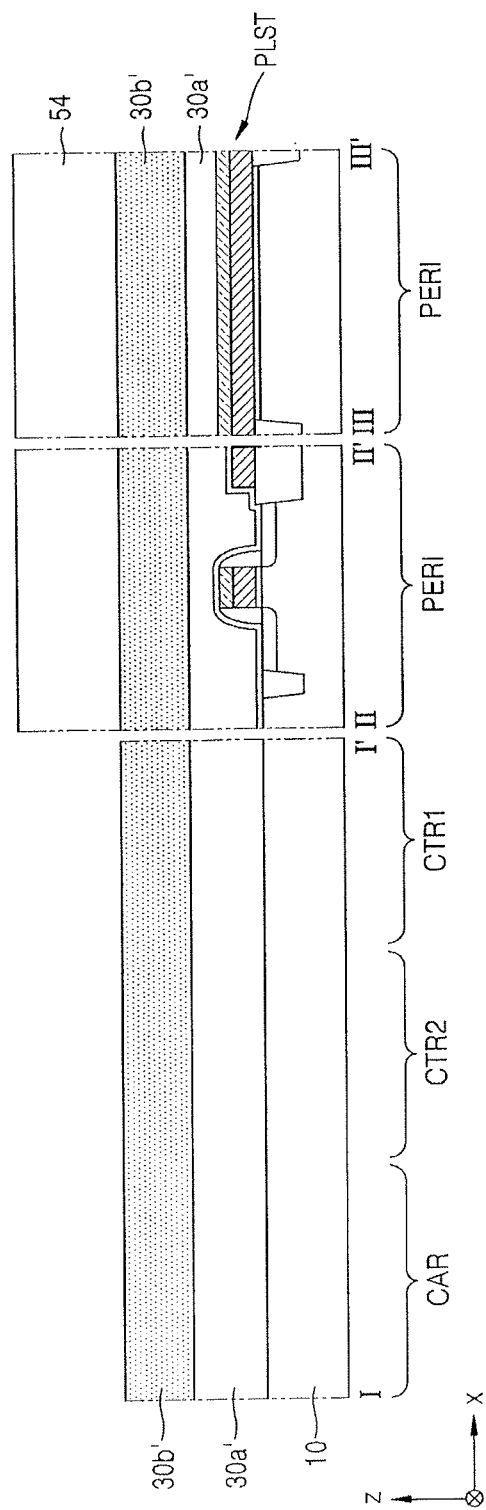
FIGS. 11 and 12 illustrate another embodiment of views for explaining a method for manufacturing a 3D semiconductor device.
Figure 12:
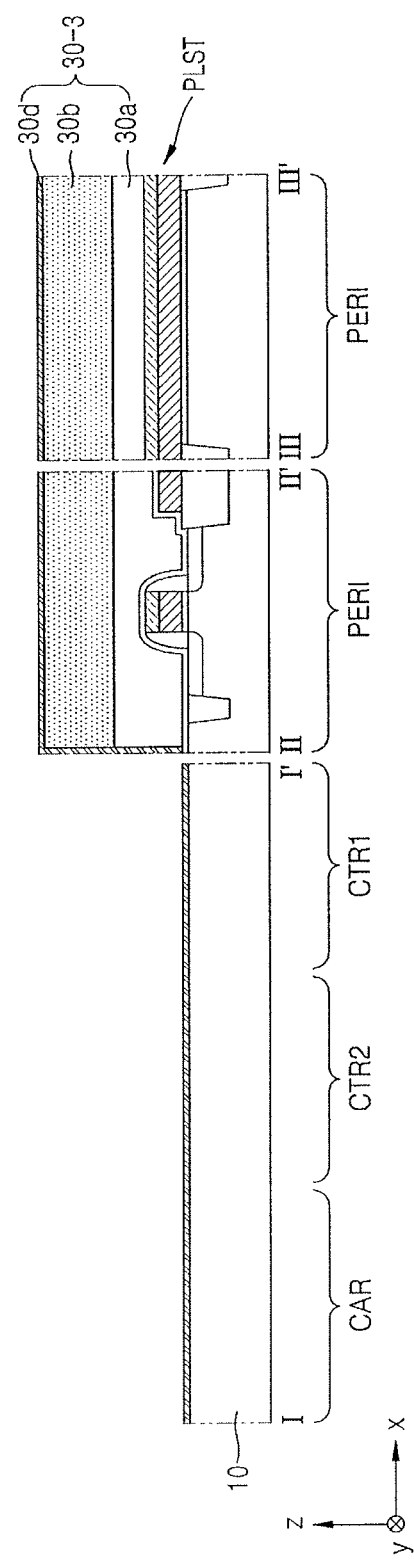

FIGS. 11 and 12 illustrate partial cross-sectional views for explaining another embodiment of a method for manufacturing a 3D semiconductor device. FIGS. 11 and 12 may explain a method for manufacturing peripheral lower insulating layer 30-3 of FIG. 7.

Referring to FIG. 11, the peripheral logic structure PLST is formed on the peripheral circuit region PERI of the substrate 10. The peripheral logic structure PLST is described with reference to FIG. 9. The silicon oxide layer 30a' and the low dielectric layer 30b' completely cover the cell array region CAR, and the first and second contact regions CTR1 and CTR2, and the peripheral circuit region PERI on the substrate 10 are formed in this order. Next, a photoresist pattern 54 is formed on the low dielectric layer 30b' of the peripheral circuit region PERI using a photolithography process.

Referring to FIG. 12, the silicon oxide layer 30a' and the low dielectric layer 30b' of the cell array region CAR and the first and second contact regions CTR1 and CTR2 are selectively etched with the photoresist pattern 54 (of FIG. 11) as an etching mask to expose substrate 10 of cell array region CAR and first and second contact regions CTR1 and CTR2.

Then, the photoresist pattern 54 (of FIG. 9) is removed. Subsequently, the protective layer 30d is formed to cover the silicon oxide layer 30a and the low dielectric layer 30b patterned in the peripheral circuit region PERI. The protective layer 30d may be formed to cover the upper surface and sidewall of the silicon oxide layer 30a and the low dielectric layer 30b. The protective layer 30d may be a double layer including a low dielectric material and a porous material. The protective layer 30d may protect one sidewall of the peripheral circuit region PERI. As a result, the peripheral lower insulating layer 30-3 may be a triple layer including the silicon oxide layer 30a, the low dielectric layer 30b, and the protective layer 30d formed on the upper surface and sidewall of the silicon oxide layer 30a and the low dielectric layer 30b.

Subsequently, the cell array structure CAST and the first and second plugs PLG1 and PLG2 are formed in the cell array region CAR and the first and second contact regions CTR1 and CTR2 as described with reference to FIGS. 5 and 7. The first to third contact pads CP1 to CP3 and the first to third lower contact plugs LCP1 to LCP3 are formed in the peripheral circuit region PERI. Next, the bit lines BL, the connection lines CL1 and CL2, and the wiring lines ICL may be formed in the cell array region CAR, the first and second contact regions CTR1 and CTR2, and the peripheral circuit region PERI.

Figure 13:
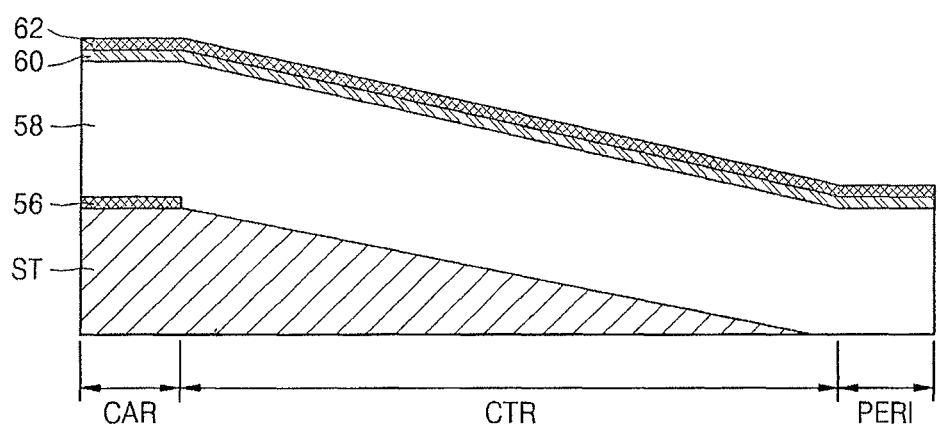
FIGS. 13 and 14 illustrate another embodiment of views for explaining a method for manufacturing a 3D semiconductor device.
Figure 14:
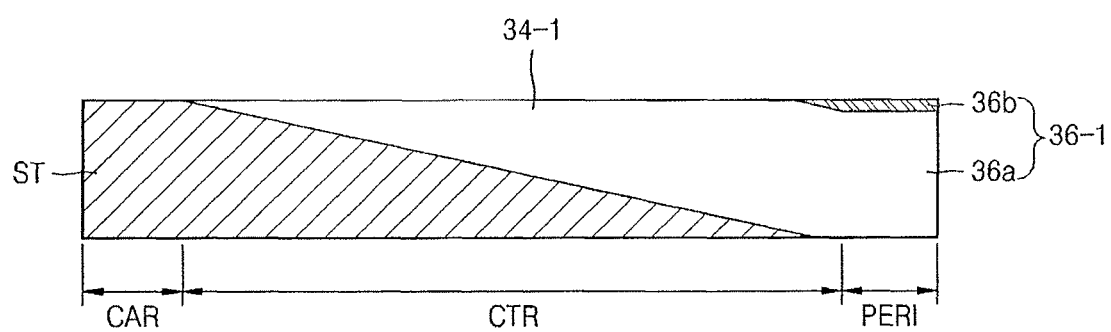

FIGS. 13 and 14 illustrate partial cross-sectional views for explaining another embodiment of a method of manufacturing a 3D semiconductor device. FIGS. 13 and 14 may explain a method for manufacturing the contact insulating layer 34-1 and the peripheral upper insulating layer 36-1 of FIG. 5.

Referring to FIG. 13, the stacked structure ST may be formed on the cell array region CAR and the contact region CTR on the substrate 10 (of FIG. 5). The vertical height of the stacked structure ST in the contact region CTR may gradually increase toward the cell array region CAR. For example, the stacked structure ST may have a profile of a slope in the contact region CTR. The stacked structure ST is described with reference to FIG. 5.

A first etch-stop layer 56 is formed on the stacked structure ST. The first etch-stop layer 56 and the stacked structure ST are sequentially formed on the cell array region CAR and the contact region CTR. A low dielectric layer 58, a thin porous layer 60, and a second etch-stop layer 62 are sequentially formed on the peripheral circuit region PERI. The second etch-stop layer 62 is formed in the peripheral circuit region PERI. The first etch-stop layer 56 and the second etch-stop layer 62 may include a silicon nitride layer.

Referring to FIG. 14, surfaces of the second etch-stop layer 62 of the cell array region CAR and the second etch-stop layer 62 of the peripheral circuit region PERI are set as etch-stop points. The second etch-stop layer 62, the porous layer 60, and the low dielectric layer 58 are chemically and mechanically polished to be planarized in this order.

Next, the first etch-stop layer 56 of the cell array region CAR and the second etch-stop layer 62 of the peripheral circuit region PERI are removed. The contact insulating layer 34-1 including the low dielectric layer 58 may be formed in the contact region CTR. The peripheral upper insulating layer 36-1 including the low dielectric layer 36a and the porous layer 36b may be formed in the peripheral circuit region PERI.

Figure 15:
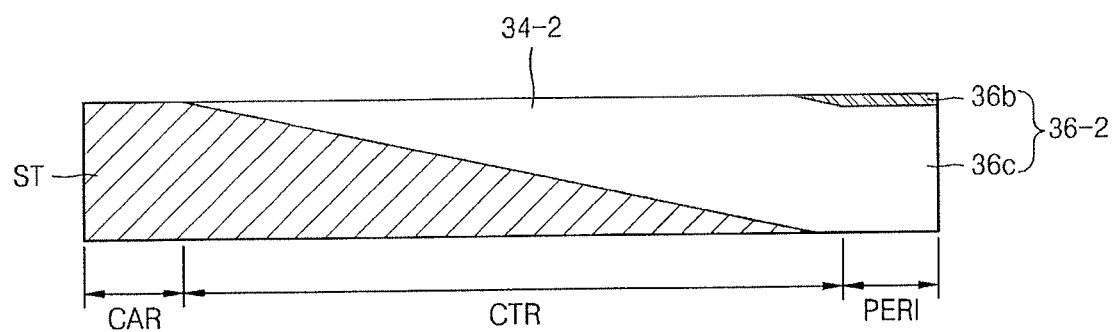
FIGS. 15 and 16 illustrate another embodiment of views for explaining a method for manufacturing a 3D semiconductor device.
Figure 16:
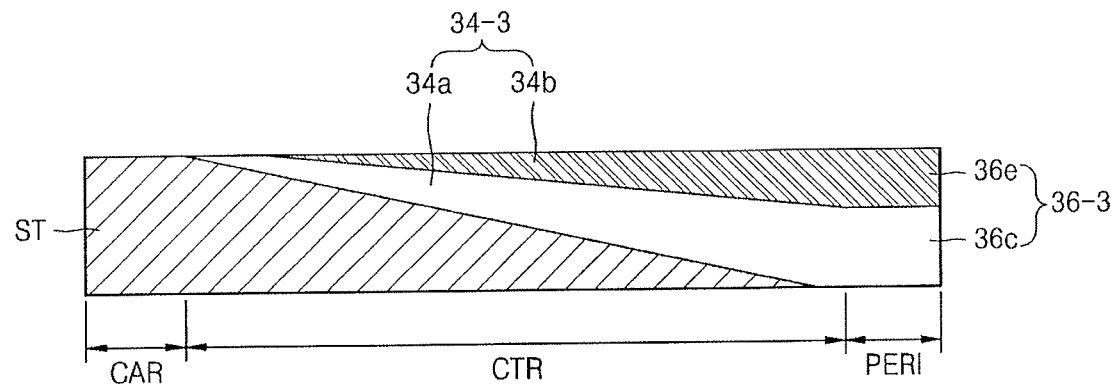

FIGS. 15 and 16 illustrate partial cross-sectional views for explaining another embodiment of a method for manufacturing a 3D semiconductor device. FIG. 15 may explain a method of manufacturing the contact insulating layer 34-2 and the peripheral upper insulating layer 36-2 of FIG. 6. FIG. 16 may explain a method of manufacturing the contact insulating layer 34-3 and the peripheral upper insulating layer 36-3 of FIG. 8.

The stacked structure ST may be formed on the cell array region CAR and the contact region CTR on the substrate 10 (of FIG. 5). The vertical height of the stacked structure ST in the contact region CTR may gradually increase toward the cell array region CAR. For example, the stacked structure ST may have a profile of a slope in the contact region CTR. The stacked structure ST is described with reference to FIGS. 5, 6, and 8.

In FIG. 15, the stacked structure ST on the cell array region CAR and the contact region CTR, and the silicon oxide layer 36c and the thin porous layer 36b on the peripheral circuit region PERI are formed in this order and then chemically and mechanically polished to be planarized. As a result, the contact insulating layer 34-2 including the silicon oxide layer 36c may be formed in the contact region CTR. The peripheral upper insulating layer 36-2 including the silicon oxide layer 36c and the porous layer 36b may be formed in the peripheral circuit region PERI.

In FIG. 16, the stacked structure ST on the cell array region CAR and the contact region CTR, and the silicon oxide layer 36c and the thick porous layer 36e on the peripheral circuit region PERI are formed in this order and then chemically and mechanically polished to be planarized. The contact insulating layer 34-3 including the silicon oxide layer 34a and the porous layer 34b may be formed in the contact region CTR. The peripheral upper insulating layer 36-3 including the silicon oxide layer 36c and the porous layer 36e may be formed in the peripheral circuit region PERI.

FIGS. 17 to 21 illustrate partial cross-sectional views for explaining another embodiment of a method for manufacturing a 3D semiconductor device. FIGS. 17 to 21 may explain a method for manufacturing peripheral upper wiring insulating layer 49-1 of FIG. 5.

Figure 17:
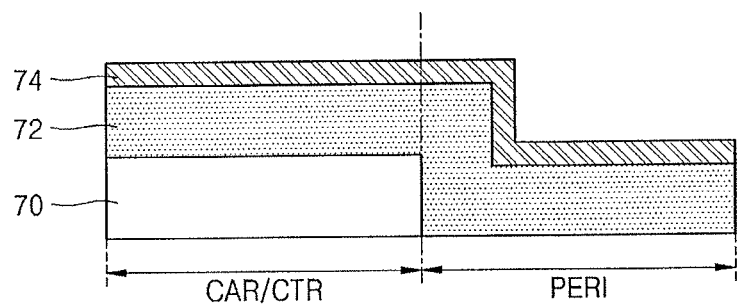
FIGS. 17 to 21 illustrate another embodiment of views for explaining a method for manufacturing a 3D semiconductor device.

Referring to FIG. 17, a silicon oxide layer 70 may be formed on the cell array region CAR and the contact region CTR. An oxide material layer is formed on the cell array region CAR, the contact region CTR, and the peripheral circuit region PERI and then patterned by a photolithography process to form the silicon oxide layer 70 in the cell array region CAR and the contact region CTR.

Since the silicon oxide layer 70 is formed only in the cell array region CAR and the contact region CTR, a step may be formed between the cell array region CAR and the contact region CTR and the peripheral circuit region PERI.

Next, a low dielectric material layer 72 and a porous material layer 74 are sequentially formed on the silicon oxide layer 70 on the cell array region CAR and the contact region CTR. The low dielectric material layer 72 may be formed on a surface and a sidewall of the silicon oxide layer 70.

Figure 18:
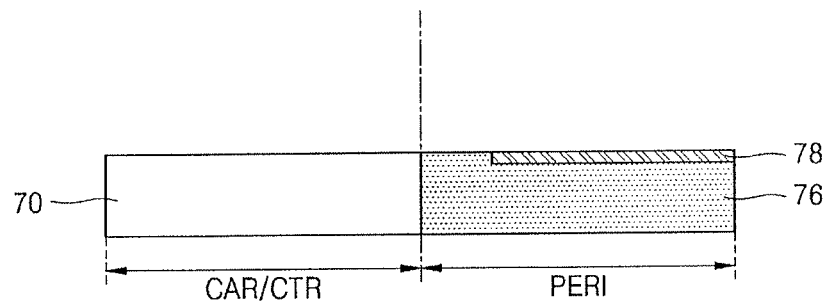
Figure 19:
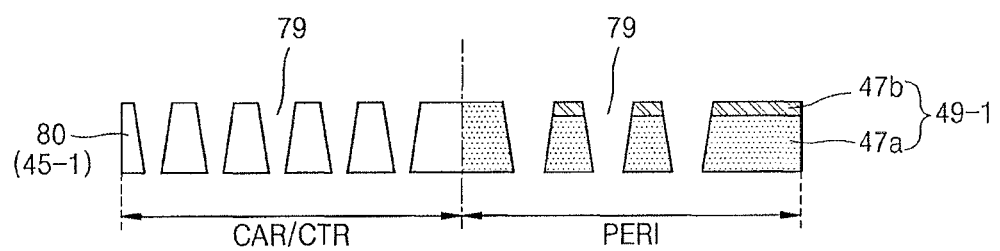

Referring to FIGS. 18 and 19, the surface of the silicon oxide layer 70 is set as an etch-stop point. The porous material layer 74 and the low dielectric material layer 72 of the cell array region CAR, the contact region CTR, and the peripheral circuit region PERI are chemically and mechanically polished to be planarized. The silicon oxide layer 70 is formed in the cell array region CAR and the contact region CTR, and a low dielectric layer 76 and a thin porous layer 78 on the low dielectric layer 76 are formed in the peripheral circuit region PERI.

Furthermore, as illustrated in FIG. 19, via holes 79 are formed in the cell array region CAR, the contact region CTR, and the peripheral circuit region PERI by patterning the silicon oxide layer 70, the low dielectric layer 76, and the porous layer 78. As a result, the upper wiring insulating layer 45-1 may be formed in the cell array region CAR and the contact region CTR as a patterned silicon oxide layer 80, and the peripheral upper wiring insulating layer 49-1 may be formed in the peripheral circuit region PERI as the patterned low dielectric layer 47*a* and the patterned porous layer 47*b*.

Figure 20:
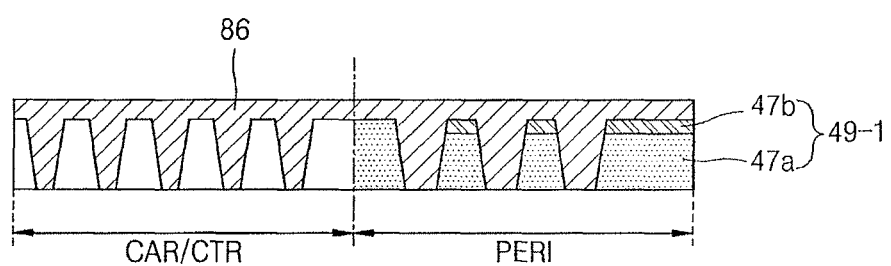
Figure 21:
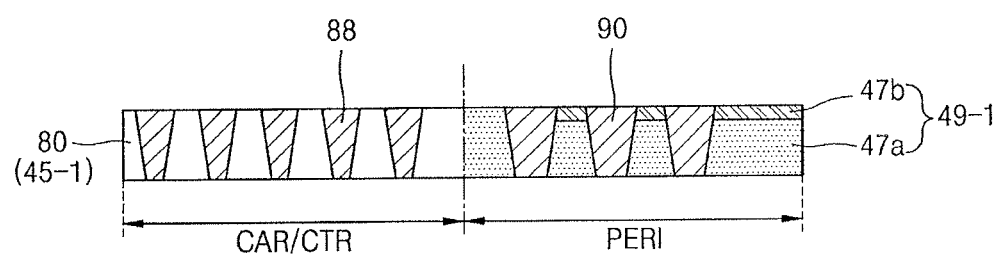

Referring to FIGS. 20 and 21, as illustrated in FIG. 20, a metal layer 86 (e.g., a copper layer) is formed to sufficiently fill the via holes 79 of the cell array region CAR, the contact region CTR, and the peripheral circuit region PERI. Furthermore, as illustrated in FIG. 21, a surface of the upper wiring insulating layer 45-1 and the peripheral upper wiring insulating layer 49-1 is set as an etch-stop point, and the metal layer 86 is chemically and mechanically polished to be planarized.

As a result, as illustrated in FIG. 21, wiring layers 88 and 90 may be formed in the cell array region CAR, the contact region CTR, and the peripheral circuit region PERI. Formation of the wiring layers 88 and 90 may be performed, for example, by a damascene process. The wiring layer 88 of the cell array region CAR and the contact region CTR may be a bit line BL or a connection line CL and the wiring layer 90 of the peripheral circuit region may be a wiring line ICL.

Figure 22:
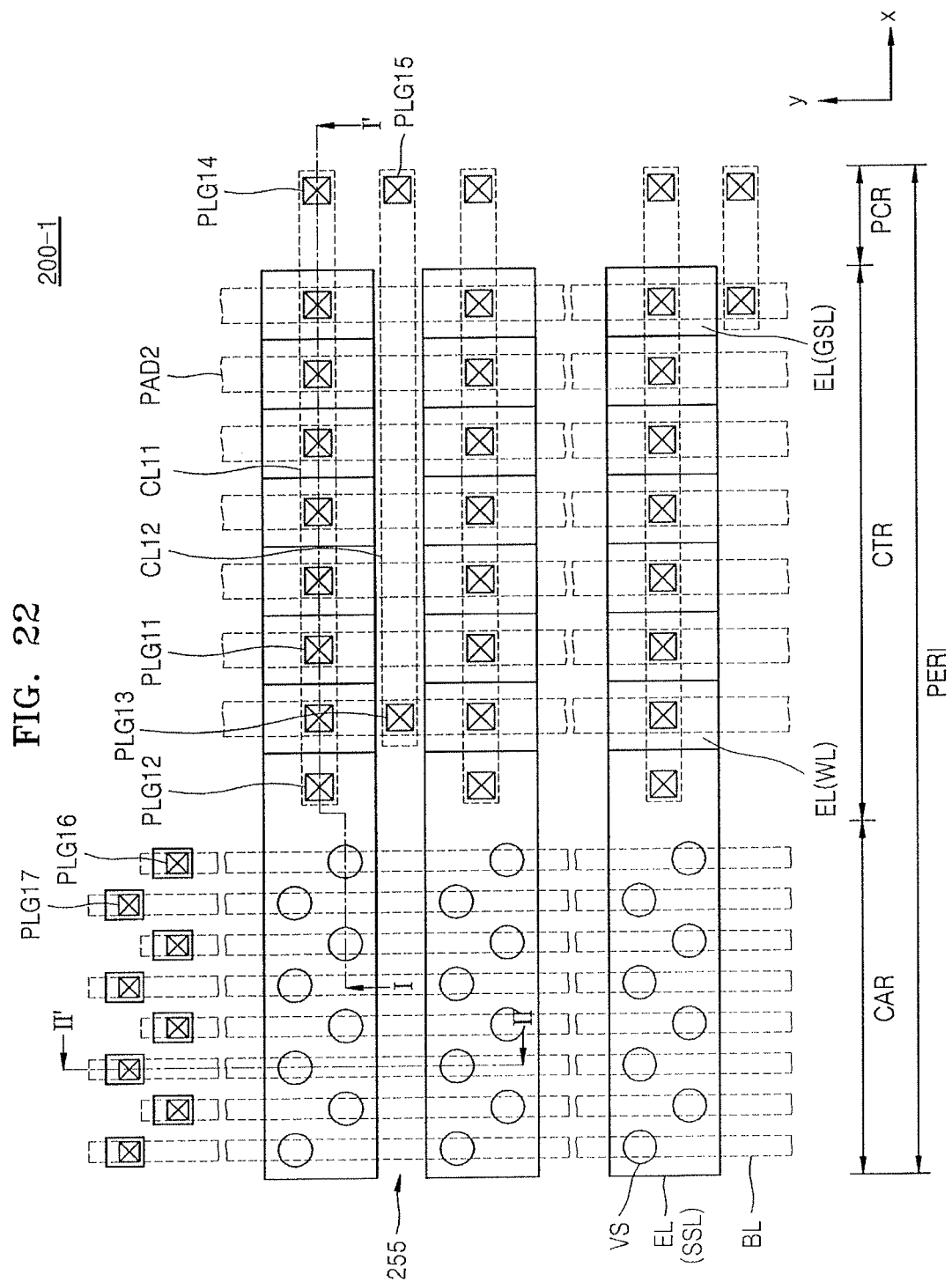
FIG. 22 illustrates another embodiment of a 3D semiconductor device.
Figure 23:
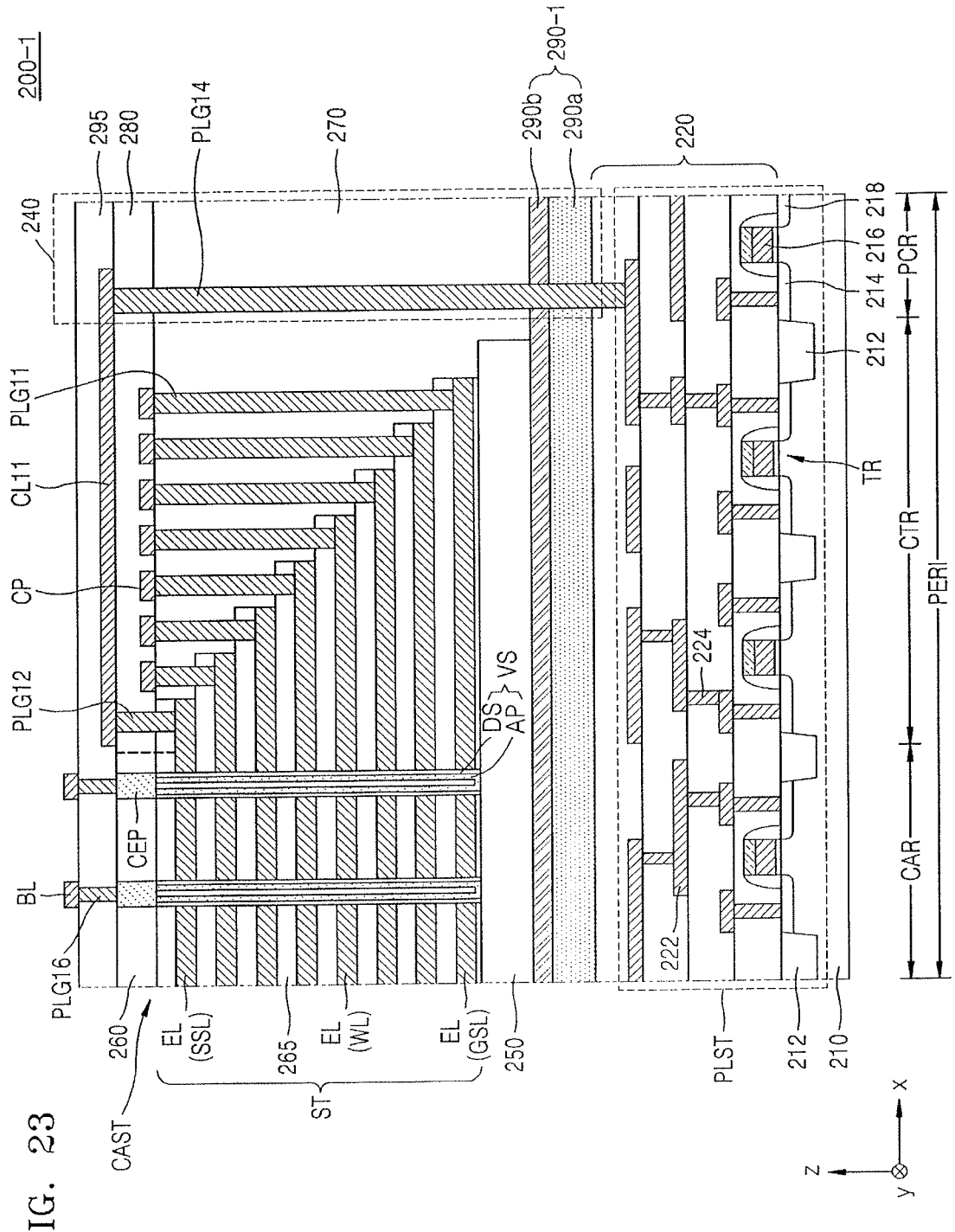
FIGS. 23 and 24 illustrate views taken along section lines I-I' and II-II' in FIG. 22, respectively.
Figure 24:
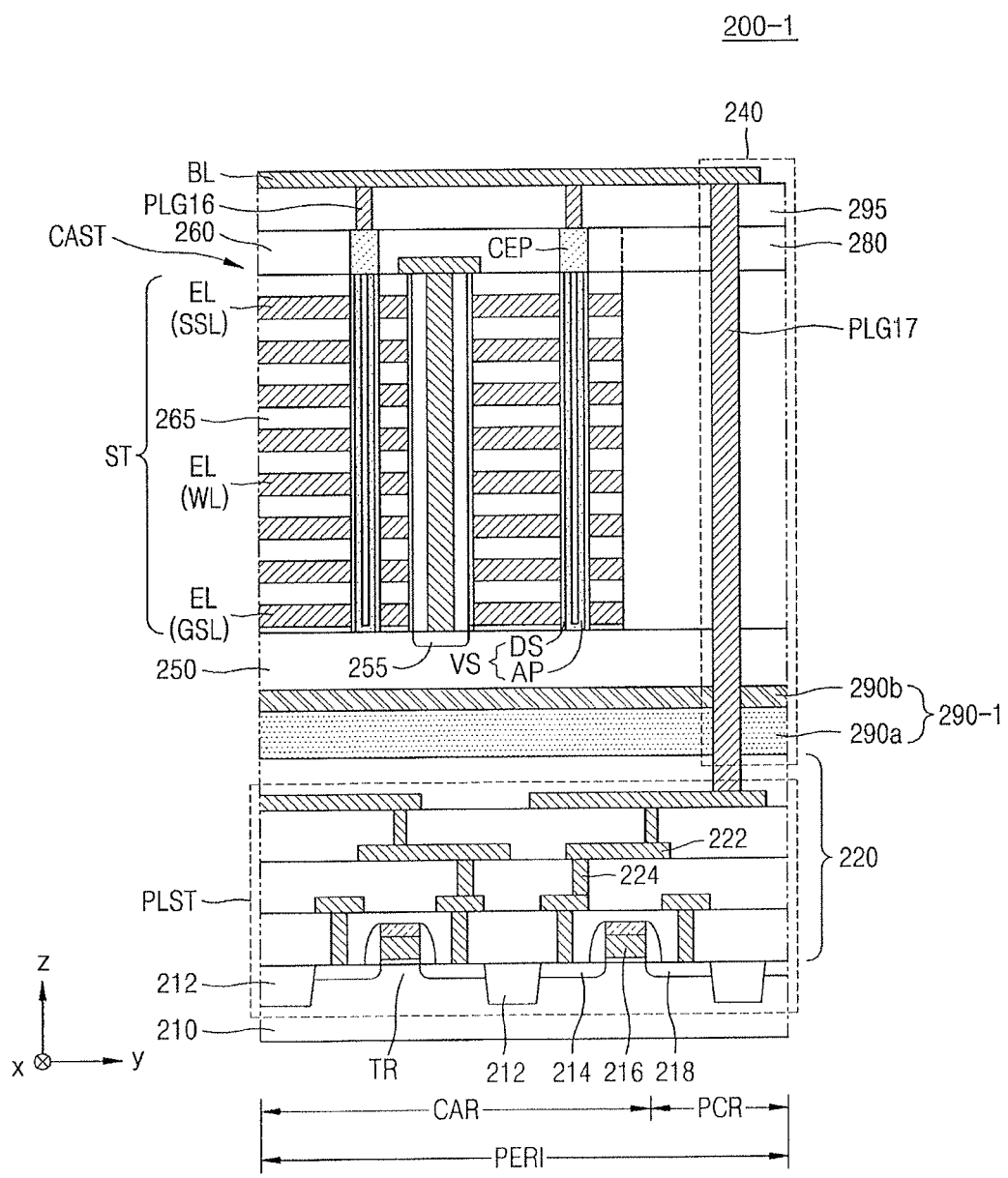

FIG. 22 illustrates a plan view of another embodiment of a 3D semiconductor device 200-1. FIGS. 23 and 24 illustrates cross-sectional views taken along lines I-I' and II-II' of FIG. 22, respectively.

The 3D semiconductor device 200-1 of the present example embodiment may include the peripheral circuit region PERI on a substrate 210. The peripheral logic structure PLST may be on the substrate 210 of the peripheral circuit region PERI. The peripheral logic structure PLST may include the transistors TR. The transistors TR may be in an active region defined by a device isolation layer 212. The transistors TR may be connected to lower wires 222 and lower contacts 224 in a peripheral lower insulating layer 220. The peripheral lower insulating layer 220 may include a plurality of silicon oxide layers.

The cell array region CAR, the contact region CTR, and a peripheral connection region PCR may be vertically arranged on the peripheral circuit region PERI. A peripheral upper insulating layer 290-1 may be on the peripheral lower insulating layer 220 and the lower wirings 222 of the peripheral circuit region PERI. The peripheral upper insulating layer 290-1 may include a low dielectric layer 290*a* and a porous layer 290*b* having a lower dielectric constant than silicon oxide layers.

A semiconductor layer 250 may be formed on the peripheral upper insulating layer 290-1 of the cell array region CAR. The semiconductor layer 250 may not be in the peripheral connection region PCR. The semiconductor layer 250 may include at least one of a single crystal silicon layer, a silicon-on-insulator (SOI) layer, a silicon layer formed on a silicon germanium (SiGe) layer, a silicon single crystal layer formed on an insulating layer, or a polysilicon layer formed on the insulating layer. The semiconductor layer 250 may be of a first conductivity type (e.g., a P-type).

The cell array structure CAST may be on the semiconductor layer 250 of the cell array region CAR. The cell array structure CAST may include the stacked structure ST including electrodes EL vertically stacked on the semiconductor layer 250 and the vertical structures VS penetrating through the stacked structure ST. The cell pad CEP may be on the vertical structure VS. A cell insulating layer 260 may between cell pads CEP. The cell insulating layer 260 may be, for example, a silicon oxide layer or a low dielectric layer having a lower dielectric constant than the silicon oxide layer.

The stacked structure ST may include electrode separation insulating layers 265 that are vertically adjacent to the electrodes EL. The electrodes EL may include the ground selection line GSL, the word lines WL, and the string selection lines SSL, which are stacked on the semiconductor layer 250 in this order.

The electrodes EL may have a stepwise structure adjacent to the peripheral connection region PCR. Each of the electrode separation insulating layers 265 may be, for example, a silicon oxide layer. The electrodes EL may include, for example, doped silicon, a metal (e.g., tungsten), a metal nitride, metal silicides, or combinations thereof.

Stacked structures ST may be arranged in the first direction (the x-direction) and may be spaced apart from each other in the second direction (the y-direction) intersecting the first direction. A common source region 255 may be in the semiconductor layer 250 between the stacked structures ST. The common source region 255 may extend in the first direction (the x-direction). The common source region 255 may be of a second conductivity type (e.g., an N-type). A plug PLG13 may be in the common source region 255 between the stacked structures ST.

One end of the vertical structures VS may be connected to the semiconductor layer 250. The vertical structures VS may include the vertical column AP and the data storage element DS between the vertical column AP and the electrodes EL. The vertical structures VS may be, for example, the same as those of FIG. 5.

A contact insulating layer 270 covering the contact region CTR and the peripheral connection region PCR may be on the semiconductor layer 250 and the peripheral upper insulating layer 290-1. The contact insulating layer 270 may be on the stacked structure ST and the peripheral upper insulating layer 290-1. First plugs PLG11 may be respectively connected to the ground selection line GSL and the word lines WL through the contact insulating layer 270 and the electrode separation insulating layers 265.

A second plug PLG12 may be on the stacked structure ST and connected to the string selection lines SSL. The cell pads CEP may be on the vertical column AP, respectively. Contact pads CP may be on the first plugs PLG11, respectively. The contact pads CP may be insulated by lower wiring insulating layer 280. The lower wiring insulating layer 280 may be, for example, a silicon oxide layer or a low dielectric layer having a lower dielectric constant than the silicon oxide layer.

The common source line CSL may be on the stacked structure ST and connected to a fifth plug PLG15. The common source line CSL may extend in the first direction (the x-direction). The lower wiring insulating layer 280 may be on the laminated structure ST and the contact insulating layer 270. The lower wiring insulating layer 280 may cover the cell pads CEP and the contact pads CP. A first wiring line CL11 may be on the lower wiring insulating layer 280.

The first wiring line CL11 may be connected to the string selection line SSL through the second plug PLG12 and may be connected to the peripheral logic structure PLST through a fourth plug PLG14. A second wiring line CL12 may be connected to the word lines WL and the ground selection line GSL through the third plug PLG13 and to the peripheral circuit logic structure PLST through the fifth plug PLG15. The fourth and fifth plugs PLG14 and PLG15 are in the peripheral connection region PCR and may penetrate the peripheral lower insulating layer 220, the peripheral upper insulating layer 290-1, the contact insulating layer 270, and the wiring insulating layer 280.

An upper wiring insulating layer 295 may be on the lower wiring insulating layer 280. The bit line BL may be on the upper wiring insulating layer 295. The bit line BL may be connected to the vertical structure AP through a sixth plug PLG16 and the cell pad CEP. The bit line BL may be connected to the peripheral circuit logic structure PLST through a seventh plug PLG17.

The seventh plug PLG17 is in the peripheral connection region PCR and may penetrate the peripheral lower insulating layer 220, the peripheral upper insulating layer 290-1, the contact insulating layer 270, the wiring insulating layer 280, and the upper wiring insulating layer 295. The contact insulating layer 270, the lower wiring insulating layer 280, and the upper wiring insulating layer 295 may include a silicon oxide layer. A connection structure 240 may include the fourth, fifth, and seventh plugs PLG14, PLG15, and PLG17. The connection structure 240 may further include the first plugs PLG1.

When the 3D semiconductor device 200-1 includes the peripheral upper insulating layer 290-1 including the low dielectric layer 290a having a lower dielectric constant than the silicon oxide layer and the porous layer 290b on the peripheral circuit region PERI, parasitic capacitance between the peripheral circuit region PERI and the cell array region CAR may be reduced. This, in turn, may reduce signal delay of the 3D semiconductor device 200-1.

When the 3D semiconductor device 200-1 includes the peripheral upper insulating layer 290-1 having the porous layer 290b on the peripheral circuit region PERI, the porous layer 290b may have a hydrogen adsorption function and may contribute to improving electrical characteristics of the 3D semiconductor device 200-1.

Figure 25:
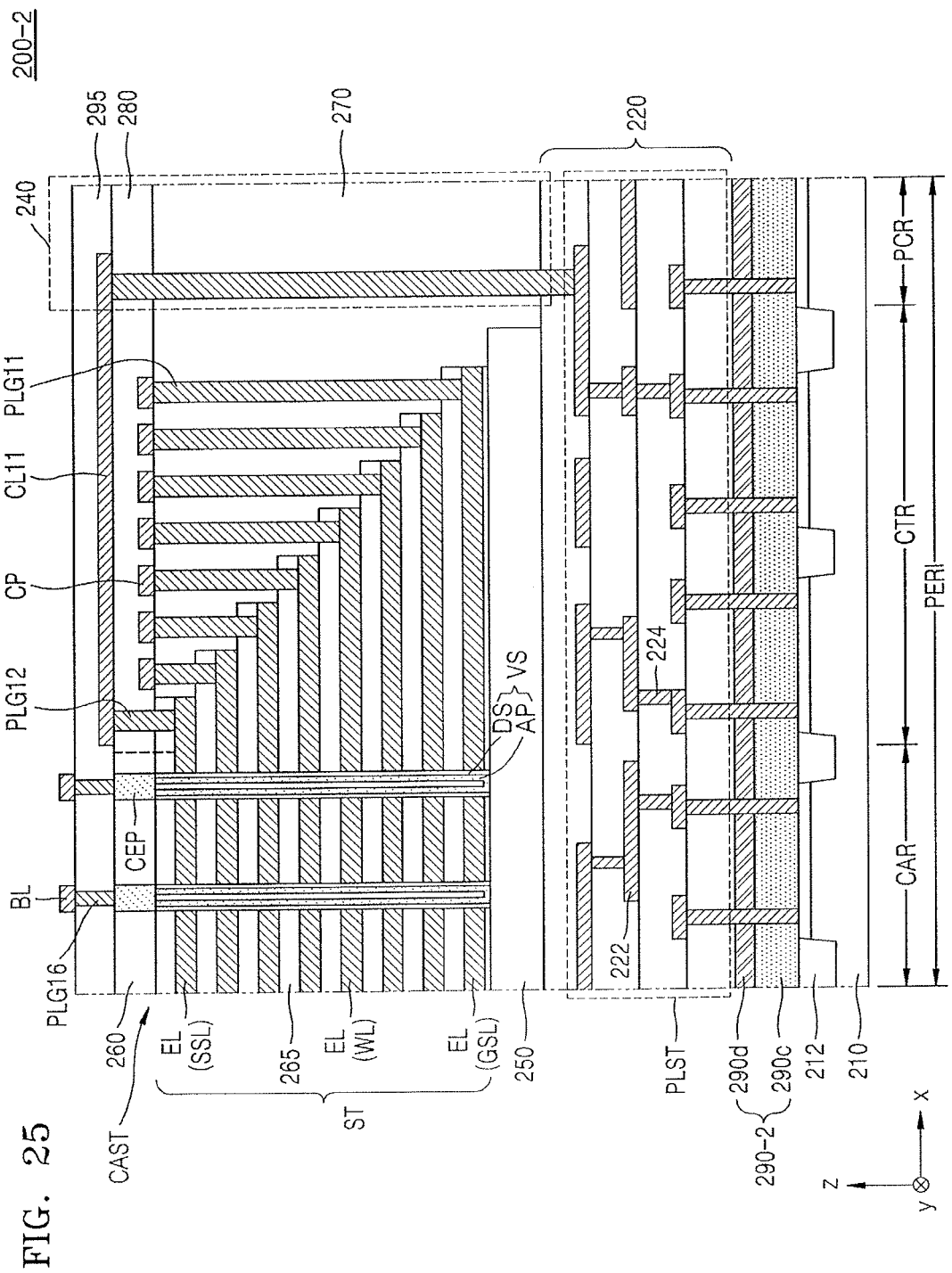
FIGS. 25 and 26 illustrate another embodiment of a 3D semiconductor device.
Figure 26:
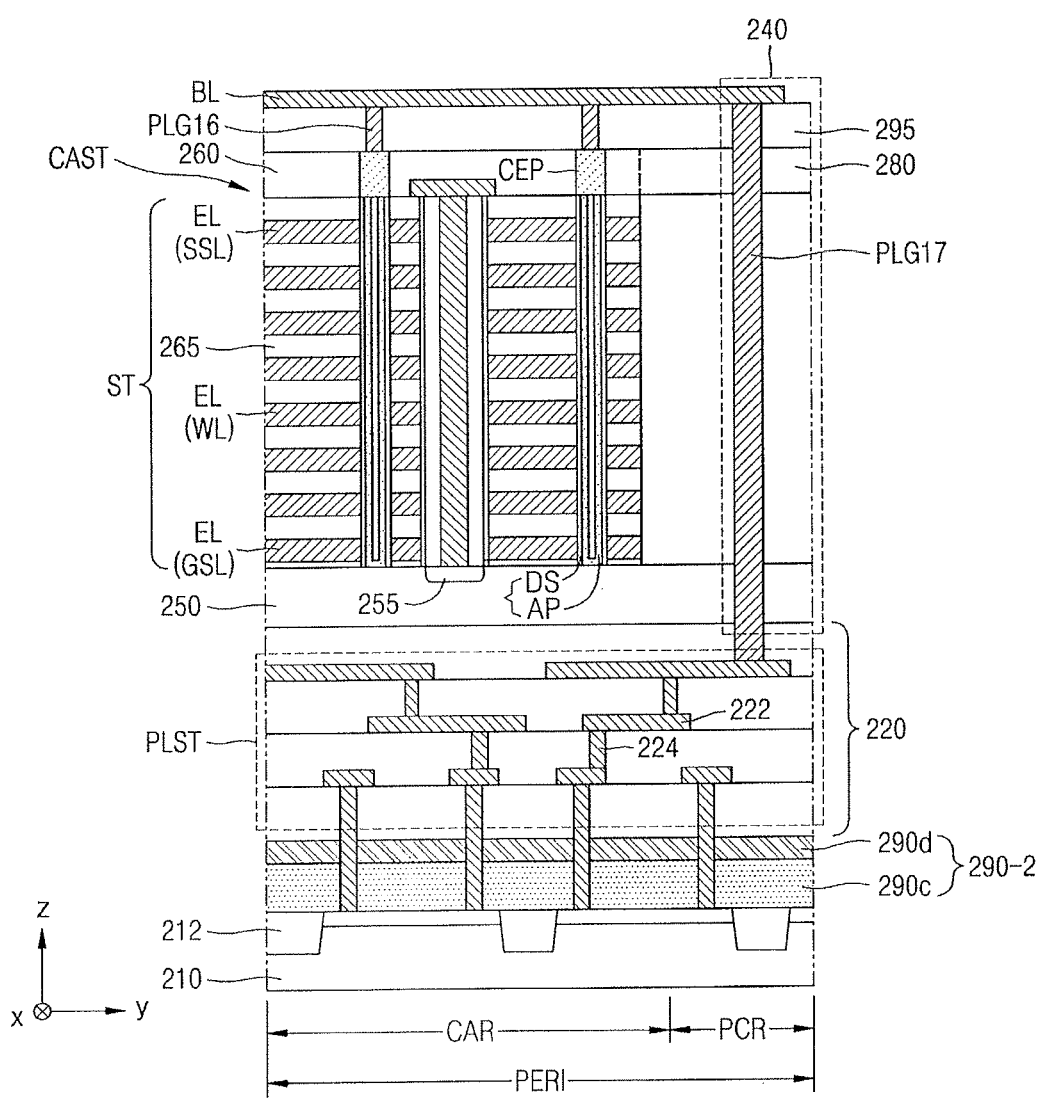

FIGS. 25 and 26 illustrate cross-sectional views of another embodiment of a 3D semiconductor device 200-2. FIGS. 25 and 26 illustrate cross-sectional views taken along lines I-I' and II-II' of FIG. 22, respectively. The 3D semiconductor device 200-2 of FIGS. 25 and 26 may be the same as the 3D semiconductor device 200-1 of FIGS. 23 and 24, except that a peripheral upper insulating layer 290-2 is between the substrate 10 and the peripheral lower insulating layer 220.

When the 3D semiconductor device 200-2 includes the peripheral upper insulating layer 290-2 including a low dielectric layer 290c having a lower dielectric constant than a silicon oxide layer and a porous layer 290d on the peripheral circuit region PERI, parasitic capacitance between the peripheral circuit region PERI and the cell array region CAR may be reduced. This may reduce signal delay of the 3D semiconductor device 200-2.

When the 3D semiconductor device 200-2 includes the peripheral upper insulating layer 290-2 having the porous layer 290d on the peripheral circuit region PERI, the porous layer 290d may have a hydrogen adsorption function and may contribute to improving electrical characteristics of the 3D semiconductor device 200-2.

In accordance with one or more of the aforementioned embodiments, a 3D semiconductor device includes a low dielectric layer or a porous layer having a lower dielectric constant than a silicon oxide layer for electrical insulation between conductive lines in a cell array region or a peripheral circuit region. As a result, electrical performance may be improved by reducing signal delay. Further, in accordance with one or more of the aforementioned embodiments, the 3D semiconductor device may improve electrical performance by providing a porous layer for insulation between conductive lines and hydrogen adsorption in a peripheral circuit region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A three-dimensional (3D) semiconductor device, comprising:
   a substrate;
   a peripheral logic structure on the substrate and including wiring layers and a peripheral insulating layer for insulating the wiring layers;
   a semiconductor layer on the peripheral logic structure;
   a stacked structure including electrodes vertically stacked on the semiconductor layer;
   a vertical structure penetrating the stacked structure; and
   four or more insulating layers between the substrate and the semiconductor layer,
   wherein at least one of the four or more insulating layers is a porous layer that is more porous than the peripheral insulating layer.

2. The 3D semiconductor device of claim 1, wherein any one of the four or more insulating layers is a low dielectric layer having a lower dielectric constant than the peripheral insulating layer, and
   wherein the low dielectric layer is between any one of the four or more insulating layers and the porous layer.

3. The 3D semiconductor device of claim 1, wherein any one of the four or more insulating layers is a low dielectric layer having a lower dielectric constant than the peripheral insulating layer,
   wherein the porous layer and the low dielectric layer are in direct contact with each other.

4. The 3D semiconductor device of claim 1, wherein any one of the four or more insulating layers is a low dielectric layer having a lower dielectric constant than the peripheral insulating layer, and
   wherein the low dielectric layer is between the substrate and a lowermost wiring layer closest to the substrate among the wiring layers under the semiconductor layer.

5. The 3D semiconductor device of claim 1, wherein the porous layer is between the substrate and a lowermost wiring layer closest to the substrate among the wiring layers under the semiconductor layer.

6. The 3D semiconductor device of claim 1, wherein any one of the four or more insulating layers is a low dielectric layer having a lower dielectric constant than the peripheral insulating layer, and
   wherein the low dielectric layer, the porous layer, and the peripheral insulating layer are sequentially formed on the substrate.

7. The 3D semiconductor device of claim 6, wherein the porous layer and the low dielectric layer are in direct contact with each other.

8. The 3D semiconductor device of claim 1, wherein any one of the four or more insulating layers is a low dielectric layer having a lower dielectric constant than the peripheral insulating layer, and
wherein the porous layer has a thickness that is smaller than that of the low dielectric layer.

9. A three-dimensional (3D) semiconductor device, comprising:
a substrate;
a peripheral circuit region on the substrate, the peripheral circuit region including a peripheral logic structure including wiring layers and a peripheral insulating layer for insulating the wiring layers;
a semiconductor layer on the peripheral circuit region;
a cell array structure on the semiconductor layer, the cell array structure having a 3D memory cell array; and
three or more insulating layers between the substrate and a lowermost wiring layer closest to the substrate among the wiring layers under the semiconductor layer.

10. The 3D semiconductor device of claim 9, wherein any one of the three or more insulating layers is a porous layer.

11. The 3D semiconductor device of claim 10, wherein any one of the three or more insulating layers is a low dielectric layer having a lower dielectric constant than the peripheral insulating layer, and
wherein the porous layer and the low dielectric layer are in direct contact with each other.

12. The 3D semiconductor device of claim 10, wherein any one of the three or more insulating layers is a low dielectric layer having a lower dielectric constant than the peripheral insulating layer, and
wherein the low dielectric layer, the porous layer, and the peripheral insulating layer are sequentially formed on the substrate.

13. The 3D semiconductor device of claim 10, wherein any one of the three or more insulating layers comprises a porous layer, and
wherein the porous layer is between the substrate and a lowermost wiring layer closest to the substrate among the wiring layers under the semiconductor layer.

14. A three-dimensional (3D) semiconductor device, comprising:
a substrate;
a peripheral logic structure on the substrate, the peripheral logic structure including wiring layers and a peripheral insulating layer for insulating the wiring layers;
a polysilicon layer on the peripheral logic structure;
a stacked structure including electrodes vertically stacked on the polysilicon layer;
a vertical structure penetrating the stacked structure; and
four or more insulating layers between the substrate and the polysilicon layer,
wherein at least one of the four or more insulating layers is a porous layer that is more porous than the peripheral insulating layer,
wherein the porous layer is between the substrate and a lowermost wiring layer closest to the substrate among the wiring layers under the polysilicon layer.

15. The 3D semiconductor device of claim 14, further comprising:
a contact plug connecting the substrate to the lowermost wiring layer; and
two or more insulating layers surrounding the contact plug,
wherein the two or more insulating layers surrounding the contact plug are on the substrate and include the porous layer.

16. The 3D semiconductor device of claim 14, wherein any one of the four or more insulating layers is a low dielectric layer having a lower dielectric constant than the peripheral insulating layer, and
wherein the low dielectric layer is between the substrate and the lowermost wiring layer.

17. The 3D semiconductor device of claim 16, wherein the porous layer and the low dielectric layer are in direct contact with each other.

18. The 3D semiconductor device of claim 14, wherein any one of the four or more insulating layers is a low dielectric layer having a lower dielectric constant than the peripheral insulating layer, and
wherein the low dielectric layer, the porous layer, and the peripheral insulating layer are sequentially formed on the substrate.

19. The 3D semiconductor device of claim 18, wherein the porous layer and the low dielectric layer are in direct contact with each other.

20. The 3D semiconductor device of claim 14, wherein any one of the four or more insulating layers is a low dielectric layer having a lower dielectric constant than the peripheral insulating layer, and
wherein the porous layer has a thickness that is smaller than that of the low dielectric layer.

* * * * *